US012136447B2

(12) United States Patent
Faleev et al.

(10) Patent No.: US 12,136,447 B2
(45) Date of Patent: Nov. 5, 2024

(54) TETRAGONAL HALF METALLIC HALF-HEUSLER COMPOUNDS

(71) Applicants: International Business Machines Corporation, Armonk, NY (US); Samsung Electronics Co., Ltd., Gyeonggi-do (KR)

(72) Inventors: Sergey Faleev, Santa Clara, CA (US); Panagiotis Charilaos Filippou, Fremont, CA (US); Yari Ferrante, San Jose, CA (US); Chirag Garg, San Jose, CA (US); Mahesh Samant, San Jose, CA (US); Jaewoo Jeong, Los Altos, CA (US)

(73) Assignees: International Business Machines Corporation, Armonk, NY (US); Samsung Electronics Co., Ltd., Gyeonggi-Do (KR)

( * ) Notice: Subject to any disclaimer, the term of this patent is extended or adjusted under 35 U.S.C. 154(b) by 117 days.

(21) Appl. No.: 17/710,399

(22) Filed: Mar. 31, 2022

(65) Prior Publication Data

US 2023/0317129 A1    Oct. 5, 2023

(51) Int. Cl.
*G11C 16/04* (2006.01)
*G11C 11/16* (2006.01)
(Continued)

(52) U.S. Cl.
CPC ........ *G11C 11/161* (2013.01); *G11C 11/1655* (2013.01); *G11C 11/1657* (2013.01);
(Continued)

(58) Field of Classification Search
CPC  G11C 11/161; G11C 11/1655; G11C 11/1657
See application file for complete search history.

(56) References Cited

U.S. PATENT DOCUMENTS 10,305,027 B2    5/2019   Kato
10,355,201 B2    7/2019   Suzuki
(Continued)

FOREIGN PATENT DOCUMENTS

JP    5383744    12/2012

OTHER PUBLICATIONS

U.S. Appl. No. 17/710,438, filed Mar. 31, 2022, Faleev et al.*
(Continued)

*Primary Examiner* — Pho M Luu
(74) *Attorney, Agent, or Firm* — Erik Johnson; Otterstedt & Kammer PLLC

(57) ABSTRACT

A magnetoresistive random-access memory cell includes a templating layer. The templating layer includes a binary alloy having an alternating layer lattice structure. The cell further includes a half metallic half-Heusler layer including a half metallic half-Heusler material having a tetragonal lattice structure. The half metallic half-Heusler layer is located outward of the templating layer, and has a half-Heusler in-plane lattice constant that is different from an in-plane lattice constant in a cubic form of the half metallic half-Heusler material. A tunnel barrier is located outward of the half metallic half-Heusler layer, and a magnetic layer is located outward of the tunnel barrier.

25 Claims, 16 Drawing Sheets

(51) Int. Cl.
 *H10B 61/00* (2023.01)
 *H10N 50/01* (2023.01)
 *H10N 50/10* (2023.01)
 *H10N 50/85* (2023.01)

(52) U.S. Cl.
 CPC ............. *H10B 61/22* (2023.02); *H10N 50/01* (2023.02); *H10N 50/10* (2023.02); *H10N 50/85* (2023.02)

(56) References Cited

U.S. PATENT DOCUMENTS

| | | | |
|---|---|---|---|
| 10,468,455 | B2 | 11/2019 | Hu |
| 10,566,015 | B2 * | 2/2020 | Freitag ................... G11B 5/314 |
| 10,580,967 | B2 | 3/2020 | Min |
| 10,734,013 | B2 | 8/2020 | Gao |
| 10,867,625 | B1 * | 12/2020 | Freitag ................... G11B 5/235 |
| 10,937,953 | B2 | 3/2021 | Jeong |
| 2017/0117458 | A1 | 4/2017 | Sonobe |
| 2019/0305040 | A1 | 10/2019 | Jeong |
| 2020/0027476 | A1 | 1/2020 | Inubushi |
| 2020/0243755 | A1 | 7/2020 | Jeong |
| 2022/0262555 | A1 * | 8/2022 | Jeong ...................... G11C 19/08 |
| 2023/0116592 | A1 * | 4/2023 | Samant ................... H10N 50/80 257/213 |

OTHER PUBLICATIONS

European Patent Office. Related European Application # 23151977.8-1211 / 4254415 on Sep. 14, 2023. The extended European search report. pp. 8.
Galanakis I. et al: "Magnetic phase transition in half-metallic CoMnSb and NiMnSb semi-Heusler alloys upon Cu doping: First-principles calculations", Physical Review B, vol. 77, No. 21, Jun. 11, 2008 (Jun. 11, 2008), XP093079541, us 5 pp. 214417-1 through 214417-5.
Unpublished U.S. Appl. No. 17/710,438, filed Mar. 31, 2022, Sergey Faleev et al., Tetragonal Half Metallic Heusler Compounds, pp. 1-37 plus 16 sheets drawings.
Paul J. Otterstedt, List of IBM Patents or Patent Applications Treated as Related, 2 pages, Mar. 31, 2022.
European Patent Office. Samsung Electronics Co., Ltd., et al. EP 23151064.5-121 on Apr. 4, 2023. The Communication with the Extended European Search Report. pp. 11 related European application.
Ryan Carlile et al,. Perpendicular magnetic anisotropy in half-metallic thin-film Co2CrAl. Journal of Physics: Condensed Matter. Institute of Physics Publishing, Bristol, GB, vol. 33, No. 10, Dec. 23, 2020. pp. 7.
European Patent Office. Related European Application # 23151064.5-1212 on Dec. 19, 2023. The European search report. pp. 5.
Wang, X., et al., "Magneto-Electronic Properties and Tetragonal Deformation of Rare-Earth-Element-Based Quaternary Heusler Half-Metals: A First-Principles Prediction," Journal of Alloys and Compounds 734 (2018): 329-341.
Sakuraba, Y., et al., "Giant Tunneling Magnetoresistance in Co2MnSi/Al—O/Co2MnSi Magnetic Tunnel Junctions," Applied Physics Letters 88, 192508 (2006); doi.org/10.1063/1.2202724.
Bowen, M., et al., "Nearly Total Spin Polarization in La2/3Sr1/3MnO3 from Tunneling Experiments," Applied Physics Letters 82, 233 (2003); doi.org/10.1063/1.1534619.
Tsunegi, Sumito, et al., "Large Tunnel Magnetoresistance in Magnetic Tunnel Junctions using a Co2MnSi Heusler Alloy Electrode and a MgO Barrier," Applied Physics Letters 93, 112506 (2008); doi.org/10.1063/1.2987516.
Tezuka, N., et al., "Improved Tunnel Magnetoresistance of Magnetic Tunnel Junctions with Heusler Co2FeAl0.5Si0.5 Electrodes Fabricated by Molecular Beam Epitaxy," Applied Physics Letters 94, 162504 (2009); doi.org/10.1063/1.3116717.

Wang, Wenhong, et al., "Temperature Dependence of Tunneling Magnetoresistance in Epitaxial Magnetic Tunnel Junctions using a Co2FeAl Heusler Alloy Electrode," Physical Review B 82, 092402, Sep. 20, 2010, doi.org/10.1103/PhysRevB.82.092402.
Munira, Kamaram, et al., "Achieving Perpendicular Anisotropy in Half-Metallic Heusler Alloys for Spin Device Applications," Journal of Applied Physics 115, 17B731 (2014); doi.org/10.1063/1.4866703.
Shinohara, Koki, et al., "Methods to Induce Perpendicular Magnetic Anisotropy in Full-Heusler Co2FeSi Thin Layers in a Magnetic Tunnel Junction Structure,"AIP Advances 8, 055923 (2018); doi.org/10.1063/1.5007436.
Basha, Adham, et al., "Interface Alloying of Ultra-Thin Sputter-Deposited Co2MnSi Films as a Source of Perpendicular Magnetic Anisotropy," Journal of Magnetism and Magnetic Materials, v.489, Nov. 1, 2019, 165367, doi.org/10.1016/j.jmmm.2019.165367.
Wen, Zhenchao, et al., "Magnetic Tunnel Junctions with Perpendicular Anisotropy using a Co2FeAl Full-Heusler Alloy," Applied Physics Express, v.5, n.6, May 22, 2012, doi.org/10.1143/APEX.5.063003.
Wen, Zhenchao, et al., "Perpendicular Magnetization of Co2FeAl Full-Heusler Alloy Films Induced by MgO Interface," Applied Physics Letters 98, 242507 (2011), doi.org/10.1063/1.3600645.
Wu, Di, et al., "Perpendicular Magnetic Anisotropy and Magnetization Dynamics in Oxidized CoFeAl Films," Scientific Reports 5, Article No. 12352 (2015), nature.com/articles/srep12352.
Wu, Y., et al., "Perpendicular Magnetic Anisotropy in Co-Based Full Heusler Alloy Thin Films," Spin, v.5, n.4, 1540012 (2015), doi.org/10.1142/S2010324715400123.
Shen Yufan, et al., "Perpendicular Magnetic Tunnel Junctions Based on Half-Metallic NiCo2O4," Applied Physics Letters 117, 109902 (2020), doi.org/10.1063/5.0017637.
Chen, Xuegang, et al., "Magnetotransport Anomaly in Room-Temperature Ferrimagnetic NiCo2O4 Thin Films," Advanced Materials, v.31, i.4, 1802560, doi.org/10.1002/adma.201805260.
Ferrante, Yari, "Development of Tetragonal Heusler Compounds with Perpendicular Anisotropy for Magnetic Random Access Memory Applications," Thesis, Martin-Luther-Universität Halle-Wittenberg, 2017.
Tunnel magnetoresistance. Downloaded from https://en.wikipedia.org/wiki/Tunnel_magnetoresistance on Nov. 26, 2021, pp. 8.
Heusler compound. Downloaded from https://en.wikipedia.org/wiki/Heusler_compound on Nov. 26, 2021. pp. 6.
Magnetoresistive RAM. Downloaded from https://en.wikipedia.org/wiki/Magnetoresistive_RAM on Nov. 26, 2021. pp. 14.
James D. Plummer et al., Silicon VLSI Technology: Fundamentals, Practice, and Modeling 1st Edition, Prentice Hall, 2001.
P.H. Holloway et al., Handbook of Compound Semiconductors: Growth, Processing, Characterization, and Devices, Cambridge University Press, 2008.
Hirohata, Atsufumi, et al., "Perpendicular Magnetic Anisotropy in Heusler Alloy Films and Their Magnetoresistive Junctions," Materials 11.1 (2018): 105, https://doi.org/10.3390/ma11010105.
Sergey V. Faleev et al,. Half-Metallic Full-Heusler and Half-Heusler Compounds with Perpendicular Magnetic Anisotropy. Phys. Status Solidi B 2023, 2200531. pp. 15.
Tanja Graf et al., Simple rules for the understanding of Heusler compounds. Progress in Solid State Chemistry 39 (2011) 1-50, 2011 Elsevier Ltd.
Stuart Parkin et al. Magnetically Engineered Spintronic Sensors and Memory. Proceedings of the IEEE, vol. 91, No. 5, May 2003. pp. 20.
Jianhua Ma et al., Computational investigation of half-Heusler/MgO magnetic tunnel junctions with (001) orientation. Journal of Applied Physics. Jun. 10, 2021;129(22) 23 pages.
Tanja Graf et al., Heusler compounds—A material class with exceptional properties. IEEE Transactions on Magnetics. Dec. 3, 2010;47(2):367-73 (Abstract 4 pages).
Tanja Graf et al., Simple rules for the understanding of Heusler compounds. Progress in solid state chemistry. May 1, 2011;39(1):1-50. (Abstract 7 pages).

* cited by examiner

101 —○ Z position, main group atom
103 —● Y position or tetrahedrally coordinated by Z
105 —◉ X position or octahedrally coordinated by Z

| | $a_c$ (Å) | $m_{tot}$ ($\mu_B$) | $E_{gap}$ (eV) | $T_C$ (K) | $a_{min}$ (Å) | $a_{max}$ (Å) | $w_{hm}$ (Å) | $a_{opt}$ (Å) | $c'_{opt}$ | $K_v$ (MJ/m³) | SP |
|---|---|---|---|---|---|---|---|---|---|---|---|
| KCrTe | 5.06 | 5.00 | 2.84 | 155 | 4.48 | 5.72 | 1.24 | 4.48 | 0.889 | 0.41 | 1.00 |
| NaCsP | 5.54 | 1.00 | 1.48 | 313 | 4.94 | 6.14 | 1.20 | 4.94 | 0.877 | 0.37 | 1.00 |
| NaCsAs | 5.68 | 1.00 | 1.24 | 291 | 5.08 | 6.28 | 1.20 | 5.10 | 0.887 | 1.28 | 1.00 |
| CsRbAs | 6.03 | 1.00 | 1.36 | 345 | 5.43 | 6.63 | 1.20 | 5.57 | 0.817 | 0.38 | 1.00 |
| CsRbN | 5.20 | 1.00 | 1.46 | 118 | 4.60 | 5.80 | 1.20 | 5.80 | 0.630 | 0.20 | 1.00 |
| NaKP | 5.22 | 1.00 | 1.97 | 341 | 4.62 | 5.82 | 1.20 | 5.82 | 0.590 | 0.00 | 1.00 |
| CsRbP | 5.88 | 1.00 | 1.59 | 289 | 5.28 | 6.44 | 1.16 | 6.38 | 0.624 | 0.06 | 1.00 |
| KCaGe | 5.38 | 1.00 | 1.12 | 260 | 4.96 | 6.04 | 1.08 | 6.02 | 0.615 | 0.38 | 1.00 |
| RbCrTe | 5.20 | 5.00 | 2.60 | 113 | 4.64 | 5.72 | 1.08 | 4.74 | 0.844 | 0.13 | 1.00 |
| CsBaC | 5.22 | 1.00 | 0.75 | 417 | 4.74 | 5.78 | 1.04 | 4.98 | 0.754 | 0.44 | 1.00 |
| LiSrGe | 5.07 | 1.00 | 1.38 | 253 | 4.75 | 5.73 | 0.98 | 5.71 | 0.585 | 0.25 | 1.00 |
| RbSrGe | 5.68 | 1.00 | 0.61 | 265 | 5.30 | 6.28 | 0.98 | 6.28 | 0.613 | 0.03 | 1.00 |
| KCaSn | 5.66 | 1.00 | 1.19 | 217 | 5.28 | 6.26 | 0.98 | 6.24 | 0.608 | 1.39 | 1.00 |
| KCaSi | 5.34 | 1.00 | 1.24 | 283 | 4.90 | 5.82 | 0.92 | 5.18 | 0.750 | 0.01 | 1.00 |
| NaVSi | 4.42 | 2.00 | 0.81 | 676 | 4.08 | 4.98 | 0.90 | 4.94 | 0.596 | 0.15 | 1.00 |
| RbSrSi | 5.63 | 1.00 | 0.99 | 287 | 5.19 | 6.09 | 0.90 | 6.09 | 0.629 | 0.06 | 1.00 |
| RbSrB | 5.30 | 2.00 | 0.75 | 450 | 5.08 | 5.94 | 0.86 | 5.08 | 0.743 | 0.05 | 1.00 |
| NaCaGe | 5.07 | 1.00 | 1.27 | 267 | 4.79 | 5.61 | 0.82 | 5.59 | 0.608 | 0.35 | 1.00 |
| KSrB | 5.16 | 2.00 | 0.82 | 509 | 4.94 | 5.76 | 0.82 | 4.94 | 0.746 | 0.01 | 1.00 |
| KTaSn | 5.08 | 2.00 | 0.68 | 236 | 4.80 | 5.60 | 0.80 | 5.56 | 0.599 | 13.89 | 1.00 |

FIG. 3A

| | $a_c$ (Å) | $m_{tot}$ ($\mu_B$) | $E_{gap}$ (eV) | $T_C$ (K) | $a_{min}$ (Å) | $a_{max}$ (Å) | $w_{hm}$ (Å) | $a_{opt}$ (Å) | $c_{opt}$ | $K_v$ (MJ/m³) | SP |
|---|---|---|---|---|---|---|---|---|---|---|---|
| RbTaGe | 4.95 | 2.00 | 0.63 | 510 | 4.77 | 5.55 | 0.78 | 5.37 | 0.624 | 10.72 | 1.00 |
| CsSrSn | 6.09 | 1.00 | 0.65 | 240 | 5.95 | 6.73 | 0.78 | 6.71 | 0.609 | 0.61 | 1.00 |
| CsVS | 4.91 | 4.00 | 2.80 | 19 | 4.77 | 5.55 | 0.78 | 5.45 | 0.617 | 0.14 | 1.00 |
| RbSrC | 4.97 | 1.00 | 0.59 | 210 | 4.37 | 5.15 | 0.78 | 4.79 | 0.740 | 0.03 | 1.00 |
| CsSrC | 5.10 | 1.00 | 0.45 | 420 | 4.52 | 5.28 | 0.76 | 4.84 | 0.757 | 0.28 | 1.00 |
| RbTaSi | 4.87 | 2.00 | 0.60 | 450 | 4.75 | 5.51 | 0.76 | 5.27 | 0.628 | 10.61 | 1.00 |
| KBaB | 5.33 | 2.00 | 0.68 | 301 | 5.25 | 5.97 | 0.72 | 5.25 | 0.720 | 0.09 | 1.00 |
| CoVSb | 4.12 | 1.00 | 0.93 | 204 | 3.74 | 4.46 | 0.72 | 4.28 | 0.661 | 0.06 | 1.00 |
| RbNbSn | 5.10 | 2.00 | 0.73 | 658 | 4.62 | 5.34 | 0.72 | 5.34 | 0.666 | 0.06 | 1.00 |
| RbNbSi | 4.79 | 2.00 | 0.80 | 707 | 4.57 | 5.25 | 0.68 | 4.57 | 0.764 | 0.28 | 1.00 |
| KMgGe | 5.14 | 1.00 | 0.28 | 280 | 4.92 | 5.60 | 0.68 | 5.60 | 0.627 | 0.08 | 1.00 |
| MnMnAs | 3.97 | 1.00 | 1.10 | 1341 | 3.69 | 4.35 | 0.66 | 3.81 | 0.765 | 0.00 | 1.00 |
| RbCaB | 5.14 | 2.00 | 0.78 | 488 | 5.00 | 5.64 | 0.64 | 5.00 | 0.733 | 0.04 | 1.00 |
| CsSrGe | 5.81 | 1.00 | 0.39 | 280 | 5.71 | 6.31 | 0.60 | 5.73 | 0.727 | 0.04 | 1.00 |
| CoCrAs | 3.91 | 2.00 | 1.12 | 794 | 3.57 | 4.15 | 0.58 | 3.57 | 0.869 | 0.25 | 1.00 |
| LiBaGe | 5.14 | 1.00 | 1.14 | 195 | 5.20 | 5.78 | 0.58 | 5.20 | 0.730 | 0.09 | 1.00 |
| CoCrSb | 4.11 | 2.00 | 0.81 | 678 | 3.63 | 4.19 | 0.56 | 4.19 | 0.682 | 0.12 | 1.00 |
| NaCaSn | 5.34 | 1.00 | 1.14 | 216 | 5.16 | 5.72 | 0.56 | 5.72 | 0.625 | 1.13 | 1.00 |
| CoCrGe | 3.88 | 1.00 | 1.00 | 337 | 3.64 | 4.18 | 0.54 | 3.64 | 0.816 | 0.19 | 1.00 |
| RhVAs | 4.12 | 1.00 | 0.92 | 423 | 3.98 | 4.52 | 0.54 | 4.02 | 0.756 | 0.03 | 1.00 |

FIG. 3B

| | $a_c$ (Å) | $m_{tot}$ ($\mu_B$) | $E_{gap}$ (eV) | $T_C$ (K) | $a_{min}$ (Å) | $a_{max}$ (Å) | $w_{hm}$ (Å) | $a_{opt}$ (Å) | $c'_{opt}$ | $K_v$ (MJ/m³) | SP |
|---|---|---|---|---|---|---|---|---|---|---|---|
| CsNbSn | 5.17 | 2.00 | 0.25 | 620 | 5.01 | 5.53 | 0.52 | 5.53 | 0.658 | 0.15 | 1.00 |
| CsNbSi | 4.88 | 2.00 | 0.19 | 546 | 4.88 | 5.40 | 0.52 | 5.38 | 0.628 | 0.11 | 1.00 |
| CsNbGe | 4.94 | 2.00 | 0.33 | 571 | 4.86 | 5.36 | 0.50 | 5.36 | 0.644 | 0.11 | 1.00 |
| NiMnSi | 3.86 | 3.00 | 0.87 | 1420 | 3.50 | 4.00 | 0.50 | 3.50 | 0.899 | 0.04 | 1.00 |
| RhCrGe | 4.07 | 1.00 | 0.68 | 82 | 3.81 | 4.31 | 0.50 | 3.81 | 0.837 | 0.49 | 1.00 |
| LiCaGe | 4.84 | 1.00 | 1.21 | 239 | 4.70 | 5.18 | 0.48 | 5.18 | 0.627 | 0.30 | 1.00 |
| LiSrB | 4.65 | 2.00 | 1.16 | 538 | 4.59 | 5.05 | 0.46 | 4.59 | 0.720 | 0.01 | 1.00 |
| CoMnGe | 3.89 | 2.00 | 1.01 | 320 | 3.57 | 4.01 | 0.44 | 4.01 | 0.666 | 0.17 | 1.00 |
| CoMnSi | 3.80 | 2.00 | 0.80 | 523 | 3.60 | 4.04 | 0.44 | 3.70 | 0.751 | 0.03 | 1.00 |
| FeCrAs | 3.88 | 1.00 | 1.00 | 532 | 3.78 | 4.20 | 0.42 | 3.78 | 0.745 | 0.15 | 1.00 |
| RuCrAs | 4.07 | 1.00 | 0.58 | 267 | 3.95 | 4.37 | 0.42 | 3.95 | 0.759 | 0.22 | 1.00 |
| KVSi | 4.64 | 2.00 | 1.01 | 310 | 4.42 | 4.84 | 0.42 | 4.42 | 0.758 | 0.04 | 1.00 |
| NaSrB | 4.85 | 2.00 | 1.04 | 467 | 4.79 | 5.19 | 0.40 | 4.79 | 0.719 | 0.04 | 1.00 |
| RhFeSn | 4.28 | 3.00 | 0.42 | 1016 | 4.08 | 4.46 | 0.38 | 4.46 | 0.645 | 0.33 | 1.00 |
| NiVSn | 4.15 | 1.00 | 0.50 | 34 | 4.05 | 4.39 | 0.34 | 4.41 | 0.639 | 0.44 | 1.00 |
| CoFeGe | 3.89 | 3.00 | 0.39 | 1085 | 3.81 | 4.11 | 0.30 | 4.11 | 0.635 | 0.09 | 1.00 |
| NiVSb | 4.17 | 2.00 | 0.44 | 421 | 4.11 | 4.33 | 0.22 | 4.39 | 0.646 | 0.10 | 1.00 |
| RhFeGe | 4.09 | 3.00 | 0.41 | 1040 | 4.09 | 4.29 | 0.20 | 4.29 | 0.633 | 0.25 | 1.00 |
| MnVAs | 3.97 | 1.00 | 0.83 | 441 | 3.91 | 4.07 | 0.16 | 4.09 | 0.667 | 0.04 | 1.00 |

FIG. 3C

| | $m_{tot}$ ($\mu_B$) | $E_{gap}$ (eV) | $T_C$ (K) | $a_{min}$ (Å) | $a_{max}$ (Å) | $w_{hm}$ (Å) | $a_{opt}$ (Å) | $c'_{opt}$ | $K_v$ (MJ/m³) | SP |
|---|---|---|---|---|---|---|---|---|---|---|
| KCrTe | 5.00 | 2.84 | 155 | 4.48 | 5.72 | 1.24 | 4.48 | 0.889 | 0.41 | 1.00 |
| NaCsP | 1.00 | 1.48 | 313 | 4.94 | 6.14 | 1.20 | 4.94 | 0.877 | 0.37 | 1.00 |
| NaCsAs | 1.00 | 1.24 | 291 | 5.08 | 6.28 | 1.20 | 5.1 | 0.887 | 1.28 | 1.00 |
| CsRbAs | 1.00 | 1.36 | 345 | 5.43 | 6.63 | 1.20 | 5.57 | 0.817 | 0.38 | 1.00 |
| KCaGe | 1.00 | 1.12 | 260 | 4.96 | 6.04 | 1.08 | 6.02 | 0.615 | 0.38 | 1.00 |
| CsBaC | 1.00 | 0.75 | 417 | 4.74 | 5.78 | 1.04 | 4.98 | 0.754 | 0.44 | 1.00 |
| LiSrGe | 1.00 | 1.38 | 253 | 4.75 | 5.73 | 0.98 | 5.71 | 0.585 | 0.25 | 1.00 |
| KCaSn | 1.00 | 1.19 | 217 | 5.28 | 6.26 | 0.98 | 6.24 | 0.608 | 1.39 | 1.00 |
| NaCaGe | 1.00 | 1.27 | 267 | 4.79 | 5.61 | 0.82 | 5.59 | 0.608 | 0.35 | 1.00 |
| KTaSn | 2.00 | 0.68 | 236 | 4.80 | 5.60 | 0.80 | 5.56 | 0.599 | 13.89 | 1.00 |
| RbTaGe | 2.00 | 0.63 | 510 | 4.77 | 5.55 | 0.78 | 5.37 | 0.624 | 10.72 | 1.00 |
| CsSrSn | 1.00 | 0.65 | 240 | 5.95 | 6.73 | 0.78 | 6.71 | 0.609 | 0.61 | 1.00 |
| CsSrC | 1.00 | 0.45 | 420 | 4.52 | 5.28 | 0.76 | 4.84 | 0.757 | 0.28 | 1.00 |
| RbTaSi | 2.00 | 0.60 | 450 | 4.75 | 5.51 | 0.76 | 5.27 | 0.628 | 10.61 | 1.00 |
| RbNbSi | 2.00 | 0.80 | 707 | 4.57 | 5.25 | 0.68 | 4.57 | 0.764 | 0.28 | 1.00 |
| CoCrAs | 2.00 | 1.12 | 794 | 3.57 | 4.15 | 0.58 | 3.57 | 0.869 | 0.25 | 1.00 |
| NaCaSn | 1.00 | 1.14 | 216 | 5.16 | 5.72 | 0.56 | 5.72 | 0.625 | 1.13 | 1.00 |
| RhCrGe | 1.00 | 0.68 | 82 | 3.81 | 4.31 | 0.50 | 3.81 | 0.837 | 0.49 | 1.00 |
| LiCaGe | 1.00 | 1.21 | 239 | 4.70 | 5.18 | 0.48 | 5.18 | 0.627 | 0.30 | 1.00 |
| RhFeSn | 3.00 | 0.42 | 1016 | 4.08 | 4.46 | 0.38 | 4.46 | 0.645 | 0.33 | 1.00 |
| NiVSn | 1.00 | 0.50 | 34 | 4.05 | 4.39 | 0.34 | 4.41 | 0.639 | 0.44 | 1.00 |
| CsRbN | 1.00 | 1.46 | 118 | 4.60 | 5.80 | 1.20 | 5.8 | 0.63 | 0.20 | 1.00 |
| RhFeGe | 3.00 | 0.41 | 1040 | 4.09 | 4.29 | 0.20 | 4.29 | 0.633 | 0.25 | 1.00 |
| CoCrGe | 1.00 | 1.00 | 337 | 3.64 | 4.18 | 0.54 | 3.64 | 0.816 | 0.20 | 1.00 |
| RuCrAs | 1.00 | 0.58 | 267 | 3.95 | 4.37 | 0.42 | 3.95 | 0.759 | 0.22 | 1.00 |

FIG. 8

| Chemical Templating Layer | $a_n$, lattice constant (Å) | $a_n' = a_n *$ Sqrt(2) (Å) |
|---|---|---|
| NiAl | 2.89 | 4.08646 |
| FeAl | 2.91 | 4.11474 |
| CoAl | 2.86 | 4.04404 |
| RuAl | 2.95 | 4.1713 |
| RhAl | 2.97 | 4.19958 |
| ReAl | 2.88 | 4.07232 |
| CoGa | 2.88 | 4.07232 |
| NiGa | 2.88 | 4.07232 |
| MnNi | 2.97 | 4.19958 |
| MnV | 2.94 | 4.15716 |
| FeTi | 2.98 | 4.21372 |
| CuZn | 2.95 | 4.1713 |
| BeTi | 2.94 | 4.15716 |
| CoSi | 2.82 | 3.98748 |
| OsSi | 2.96 | 4.18544 |
| RuSi | 2.91 | 4.11474 |
| AgF | 2.94 | 4.15716 |

FIG. 9

TETRAGONAL HALF METALLIC HALF-HEUSLER COMPOUNDS

BACKGROUND

The present invention relates generally to the electrical, electronic and computer arts and, more particularly, to magnetoresistive random-access memory (MRAM).

Current MRAMs are three-layer devices employing a magnetic tunnel junction (MTJ). They typically include a reference layer magnet, a tunnel barrier, and a storage or free magnetic layer. The magnetic layer can either be a ferromagnet or a ferrimagnet. Current is passed through the device and the resistance is measured. The resistance changes based on the magnetic orientation of the two magnetic layers, and the relative change in resistance is referred to as the tunnel magnetoresistance (TMR), which is related to the spin polarization (i.e., high spin polarization implies high TMR). High spin polarization, and thus high TMR, is desirable (higher TMR provides a higher ON/OFF ratio). Low switching current is also desirable. In a parallel configuration, the magnetic layers have their magnetizations aligned with each other; the resistance is typically lower in this state relative to the anti-parallel configuration. In the anti-parallel state, the magnetic layers do not have their magnetizations aligned with each other; the resistance is typically higher in this state relative to the parallel configuration. The magnetic state of the MTJ is changed by passing a current through it. The current delivers spin angular momentum, so that once a threshold current is exceeded, the direction of the memory layer moment is switched. Since these MRAM devices are switched using Spin Transfer Torque (STT), they are referred to as STT-MRAM. The magnitude of the switching current that is required is less when the magnetization of the electrodes is oriented perpendicular to the layers.

Current devices employ alloys of cobalt, iron, and boron for the magnetic layers and these layers are ferromagnetic. Heusler compounds are magnetic intermetallics with a face-centered cubic (FCC) crystal structure and a composition of $X_2YZ$ (full-Heuslers or simply "Heuslers"), where X and Y are transition metals and Z is in the p-block (or main group) of the periodic table. Half Heuslers have the composition XYZ. Reference herein to Heusler or Heuslers without the term "half" is intended to reference full-Heuslers. Heusler compounds have four interpenetrating FCC sublattices (for half-Heusler compounds XYZ one FCC sublattice remains unoccupied).

BRIEF SUMMARY

Principles of the invention provide techniques for using tetragonal half metallic half-Heusler compounds in MRAMs and the like. In one aspect, an exemplary magnetoresistive random-access memory cell includes a templating layer including a binary alloy having an alternating layer lattice structure; a half metallic half-Heusler layer including a half metallic half-Heusler material having a tetragonal lattice structure, the half metallic half-Heusler layer being located outward of the templating layer, and having a half-Heusler in-plane lattice constant that is different from an in-plane lattice constant in a cubic form of the half metallic half-Heusler material; a tunnel barrier outward of the half metallic half-Heusler layer; and a magnetic layer outward of the tunnel barrier.

In another aspect a magnetoresistive random-access memory array of such magnetoresistive random-access memory cells includes a plurality of bit lines and a plurality of complementary bit lines forming a plurality of bit line-complementary bit line pairs; a plurality of word lines intersecting the plurality of bit line pairs at a plurality of cell locations; and a plurality of the magnetoresistive random-access memory cells respectively located at each of the plurality of cell locations. Each of the magnetoresistive random-access memory cells is electrically connected to a corresponding bit line and selectively interconnected to a corresponding one of the complementary bit lines under control of a corresponding one of the word lines.

In still another aspect, a method of operating such an array includes providing the array; applying signals to the word lines to cause a first subset of the cells to store logical ones and a second subset of the cells to store logical zeroes; and reading the stored logical ones and zeroes via the bit lines and the complementary bit lines.

In a further aspect, a method of forming a magnetoresistive random-access memory cell includes providing a templating layer including a binary alloy having an alternating layer lattice structure and having a templating layer in-plane lattice constant; epitaxially growing a half metallic half-Heusler layer on the templating layer, the half metallic half-Heusler layer including a half metallic half-Heusler material, the half metallic half-Heusler layer being grown on the templating layer such that the half-Heusler material has a tetragonal lattice structure and a half-Heusler in-plane lattice constant that is different from an in-plane lattice constant in a cubic form of the half metallic half-Heusler material and which substantially matches the templating layer in-plane lattice constant; forming a tunnel barrier outward of the half metallic half-Heusler layer; and forming a magnetic layer outward of the tunnel barrier.

In yet a further aspect, a hardware description language (HDL) design structure is encoded on a machine-readable data storage medium. The HDL design structure includes elements that when processed in a computer-aided design system generate a machine-executable representation of a magnetoresistive random-access memory cell and/or array, as described.

As used herein, "facilitating" an action includes performing the action, making the action easier, helping to carry the action out, or causing the action to be performed. Thus, by way of example and not limitation, instructions executing on one processor might facilitate an action carried out by semiconductor processing equipment, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects. Some embodiments may not have these potential advantages and these potential advantages are not necessarily required of all embodiments. By way of example only and without limitation, one or more embodiments may provide one or more of:

MRAM devices where the cells exhibit high spin polarization (via use of half metal with spin polarization of one), and thus high TMR, and a high ON/OFF ratio.

MRAM devices where the cells exhibit low magnetization, and thus low switching current.

MRAM devices where the magnetic layers of the cells exhibit volume perpendicular magnetic anisotropy (PMA), allowing scaling to small sizes, via use of tetragonal half-metallic half-Heusler compounds (tetragonality contributes to PMA).

Fabrication techniques using an underlayer (e.g., CoAl) to permit epitaxial growth of a tetragonal half metallic half-Heusler compound.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIGS. 3A, 3B, and 3C present a table of half-metallic half-Heusler compounds that can be used in tetragonal forms in MRAM according to aspects of the invention;

FIG. 8 reproduces portions of FIGS. 3A-3C for a selected list of compounds with strong PMA;

FIG. 9 shows non-limiting examples of chemical templating layers useful in one or more embodiments;

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

We have found that tetragonal half-Heusler compounds are of interest for MRAM applications. Current MRAM devices use magnetic tunnel junction (MTJ) as a storage element. A simple MTJ is a tri-layer structure containing two magnetic layers separated by tunnel barrier layer. Current MTJs using Cobalt Iron Boron (Co/Fe/B) are able to provide magnetic layers which have magnetization perpendicular to the film surface (i.e. exhibit perpendicular magnetic anisotropy (PMA), which is desirable). The perpendicular magnetic anisotropy (PMA) of Co—Fe—B layers arises from the interfaces between these layers and the tunnel barrier and/or the underlayer on which the Co—Fe—B layer is deposited. Thus, these layers should be made sufficiently thin so that the interface PMA overcomes the demagnetization energy that arises from the magnetic volume and increases in proportion with the magnetic volume of the Co—Fe—B layer. However, their high moment requires a high switching current. One or more embodiments advantageously provide PMA but with lower moment and thus reduced switching current compared to prior art devices.

It is desirable that magnetic materials have volume PMA rather than surface (interfacial) PMA, as this enables scaling of devices to smaller sizes (typically smaller diameter). As device size is reduced, the devices become less thermally stable. However, for devices with volume anisotropy, it is advantageously possible to compensate for the lowering of thermal stability by increasing the thickness. The switching current is proportional to the product ($M_s$ V $H_k$) where $M_s$ is saturation magnetization, V is volume, and $H_k$ is the anisotropy field. Low moment (i.e., low $M_s$) half-Heusler compounds need lower switching currents, unless the increase in $H_k$ overwhelms the lower $M_s$.

Figure 1:
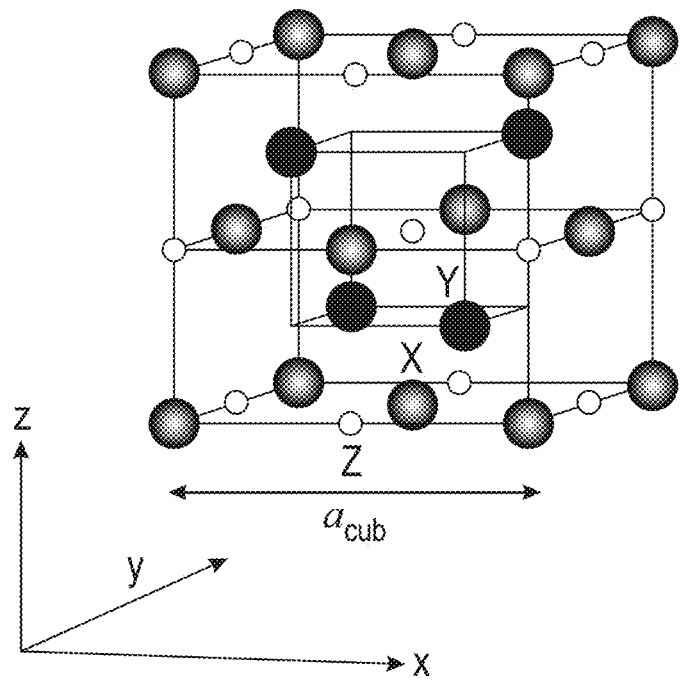
FIG. 1 shows a half-Heusler compound employed in aspects of the invention.
Figures 4, 5:
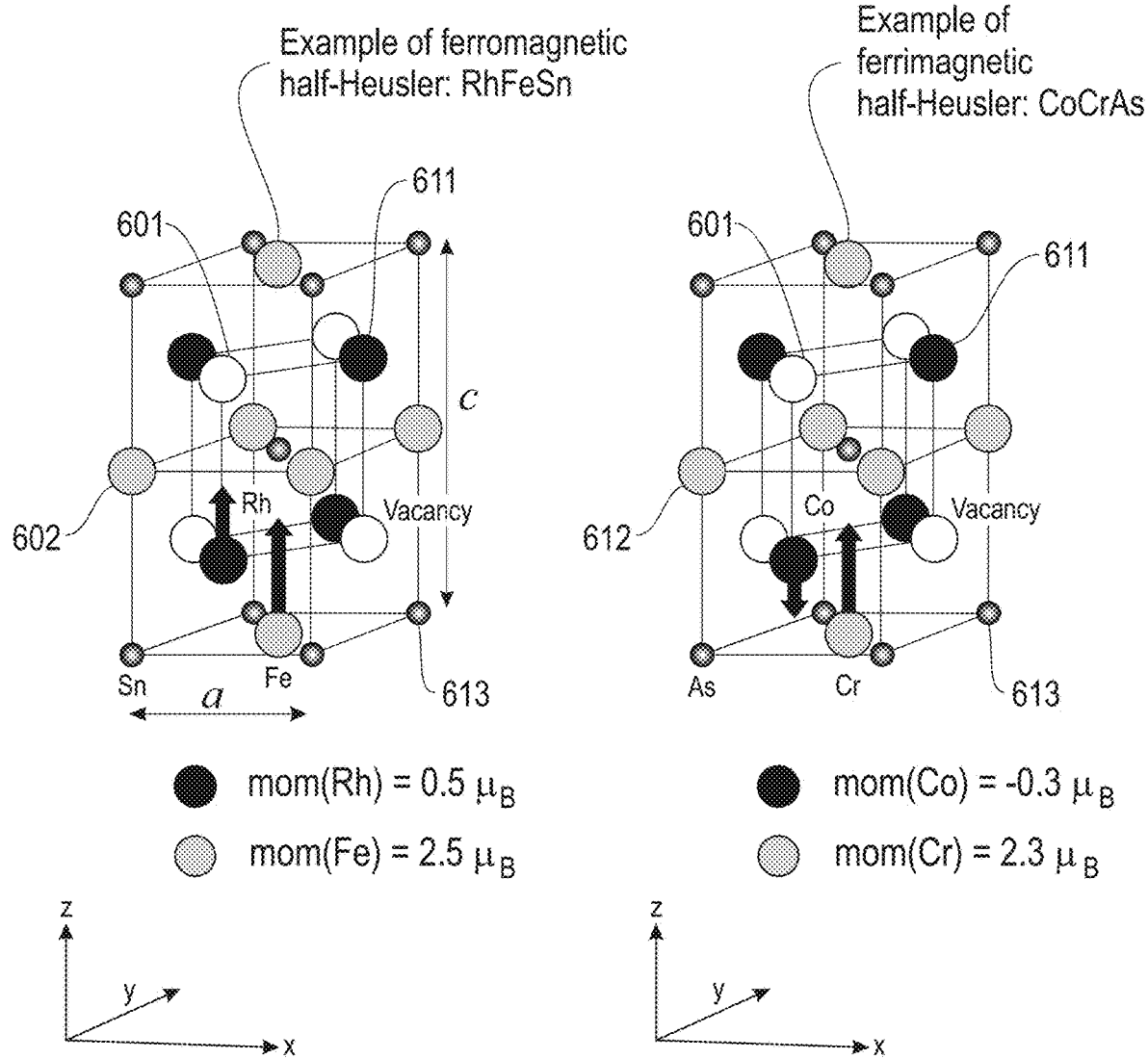
FIGS. 4 and 5 respectively depict ferromagnetic and ferrimagnetic half-metallic half-Heusler compounds that can be used in MRAM according to aspects of the invention—tetragonal unit cells shown in FIGS. 4 and 5 are rotated 45° around the z-axis relative to the parent cubic structure shown in FIG. 1.

Thus, for MRAM applications, it is desirable that all the magnetic elements have their moments perpendicular to the layer itself (i.e., magnetization perpendicular to the film plane—PMA arising from the crystalline structure). Low magnetization and low switching currents are desirable. We have found that one way to achieve PMA is via use of a half-Heusler compound. Typically, half-Heusler compounds tend to be cubic. Thus, a thin film is grown, and the magnetic moment will be in the plane of the layer. For an MTJ for MRAM applications, it is highly desirable for the magnetic moments of the magnetic layer to be perpendicular to the layer. The way to induce PMA in a half-Heusler layer is to modify the compound from being cubic to tetragonal. Instead of having all three unit cell axes to be of the same length, if one of the axes is a little longer (or shorter), then, because of breaking of the crystal symmetry, the magnetization can be perpendicular. It is worth noting that because the unit cells of the half-Heusler material discussed elsewhere herein with respect to FIG. 4 and FIG. 5 are not simple crystals with only a single element, the parameter c' discussed elsewhere herein is pertinent (the simple relationship of c=a to be cubic is not appropriate for such cells with multiple elements). In the tetragonal case, one of the axes is lengthened (or shortened) relative to the cubic case. FIG. 1 depicts aspects of a cubic half-Heusler compound and the in-plane lattice constant, $a_{cub}$. Volume PMA is desirable because it is hard to scale surface (interfacial) PMA to small cells; our calculations indicate that volume PMA is advantageously able to scale to smaller sizes. As discussed elsewhere herein, in a tetragonal case, the Z (vertical) axis is "stretched" (shrinking is also possible in alternative approaches) relative to the cubic case. Because of the bulk concentration, the magnetization tends to be perpendicular to the film (i.e., along the z axis). If the half-Heusler layer is grown with a z-axis perpendicular to the (x-y) plane, on a suitable templating layer, it will have a moment which is perpendicular to the (x-y) plane of the film.

Half metallic (HM) magnetic materials are materials that have band gap at the Fermi energy, $E_F$, in one spin channel, so DOS(spin1, $E_F$)=0, and normal metallic DOS in another spin channel, DOS(spin2, $E_F$)>0 (DOS=densities of states). Theoretically, such materials give infinite TMR when used as electrodes in MRAM devices. Unfortunately, all known half metallic half-Heusler compounds are cubic with zero volume anisotropy (due to symmetry); this makes them unsuitable for practical STT-MRAM devices. By use of appropriate templating layers, it is possible to strain the half-Heusler compound in the in-plane direction which can induce tetragonality in the half-Heusler compound. The tetragonality implies presence of PMA, suggesting suitability for use in perpendicular MTJs. If the half metallicity of the half-Heusler compounds can be made robust to in-plane strain, then the TMR from these perpendicular MTJs can be high which is highly desirable.

Further regarding half metallicity, every material has up spin and down spin. If there is a band gap in one of the spin channels, then at the Fermi level, if current is being passed, only electrons of one spin are moving. Half metals are very useful for achieving high TMR. One or more embodiments make cubic compounds tetragonal via epitaxy. Deposit the material on a templating layer (in a non-limiting example, a chemical templating layer), which forces the in-plane lattice constant to be different than the out-of-plane lattice constant. This results in tetragonality. One or more embodiments ensure that the half-metallicity (i.e., having the band gap in one of the spin channels) is still maintained. We have found that there are a number of half-Heusler compounds that are half metals. There are about three thousand half-Heusler compounds. One hundred fifty of these are half metals. Only a few of these can be made tetragonal while maintaining their half metallic property so that they have perpendicular magnetic anisotropy, i.e., so that their magnetization is perpendicular to the film. These few are advantageously employed for MRAM and likely to have high TMR.

A pertinent aspect of one or more embodiments is the variation of the in-plane lattice constant of known half metallic cubic half-Heusler compounds by using different templating layers, so that these half-Heusler compounds will become tetragonal with non-zero volume anisotropy. The templating layers can, for example, be non-magnetic binary compounds (e.g., CoAl with in-plane lattice constant a=4.04 Å) and the half metallic magnetic half-Heusler compound can, for example, be known ternary compounds (e.g., RhCrGe with $a_{cub}$=4.07 Å, NiMnSi with $a_{cub}$=3.86 Å, RhFeSn with $a_{cub}$=4.28 Å, or NiVSn with $a_{cub}$=4.15 Å). The ternary compound is strained when epitaxially grown on the CoAl layer. If the change of the in-plane lattice constant is not significant (e.g., within 5% from the equilibrium cubic lattice constant), our calculations indicate that half-metallicity is likely to remain intact, at least for some half-Heusler compounds. Thus, using DFT (Density-functional theory) calculations, we have determined several tetragonal half-Heusler compounds with non-zero volume anisotropy that are still half metallic. Furthermore in this regard, half-metallic half-Heusler compounds per se are well-known. However, heretofore, all known half-metallic half-Heusler compounds have exhibited a cubic crystal lattice structure and thus do not exhibit PMA. We have found that half-metallic half-Heusler compounds with a tetragonal crystal lattice structure can be obtained via growth on a templating layer, thus yielding PMA. We have found that growth on the templating layer "squeezes" or "stretches" the lattice constant in one direction to obtain the desired tetragonal crystal lattice structure, while maintaining the half-metallic properties (for example, "squeezing" in x and y while "stretching" in z). High TMR is expected for such compounds, based on our calculations, with templating layers used as a base for epitaxial growth.

One or more embodiments advantageously make half metallic half-Heusler compounds tetragonal with non-zero anisotropy by using an underlayer (e.g., CoAl) with a different in-plane lattice constant (as compared to the cubic form), obtaining volume anisotropy as opposed to interfacial anisotropy. One or more embodiments employ a half-Heusler half metallic compound. In one or more embodiments, the half-Heusler half metallic compound is grown on a general substrate that can be, for example, a non-magnetic metal (e.g., CoAl) or a magnetic metal (e.g., cubic $Co_2MnSi$, which is also a half metallic Heusler) and, therefore, the tetragonal half metallic half-Heusler can be the bottom electrode of the MRAM cell. On the other hand, in one or more embodiments, the half-Heusler half metallic compound is grown on a semiconductor barrier (e.g., MgO), and, therefore, the tetragonal half metallic half-Heusler can be the top electrode of the MRAM cell. Refer to FIGS. 3A, 3B and 3C. The parameter a_cub is the in-plane cubic lattice constant (also referred to herein as $a_{cub}$) which applies to a half metal in the cubic form. If this a_cub value can be changed by, say, +/−0.3 angstroms or +/−10% and the compound still stays half metallic, then the compound is considered as exhibiting robust half metallicity, and can likely be grown on a templating layer to achieve tetragonality without losing half metallicity.

It is worth noting that a half-metal is a substance that acts as a conductor to electrons of one spin orientation, but as an insulator or semiconductor to those of the opposite orientation. Known half-metals are ferromagnetic (or ferrimagnetic). In half-metals, the valence band for one spin orientation is partially filled while there is a gap in the density of states for the other spin orientation. This results in conducting behavior for only electrons in the first spin orientation. In some half-metals, the majority spin channel is the conducting one while in others the minority channel is.

We have identified nineteen half metallic half-Heuslers with PMA that stay half metallic when the in-plane lattice constant, a, varies within 0.50 Å (or 5%) in the vicinity of the corresponding cubic lattice constant, $a_{cub}$. These compounds have very stable half metallicity that is difficult to destroy by variation of the lattice constant within 10% near $a_{cub}$.

Referring again to FIG. 1, consider now aspects of a chemical templating layer. A half-Heusler compound, XYZ, such as $Mn_2As$ includes alternating layers of Mn—Mn and Mn—As atoms. In FIG. 1, atoms with shading 101 represent As atoms (main group), atoms with shading 103 represent Mn atoms of the Y-position in XYZ (tetrahedrally coordinated by Z), and atoms with shading 105 represent element Mn atoms of the X-position in XYZ (octahedrally coordinated by Z). Mn is a transition metal and As is from the main group of the periodic table. One of the alternating layers contains transition metal atoms 103 only and other contains main group element atoms 101 along with transition metal atoms 105. Thus, a seed layer containing a single element which lattice-matches the in-plane lattice constant does not promote growth of an ordered half-Heusler compound at low temperatures such as room temperature. An ideal seed layer includes a binary compound of a transition element and a main group element. Moreover, this ideal seed layer also has an alternating layer structure containing these two distinct elements. One layer has only the transition metal. The other layer has only the main group metal (the "Z" in XYZ is a main group metal as well). These binary compounds have a CsCl-like (cesium chloride-like) structure (where each cesium ion is coordinated by eight chloride ions). Exemplary templating layers include CoAl, CoGa, and the like.

Figure 2:
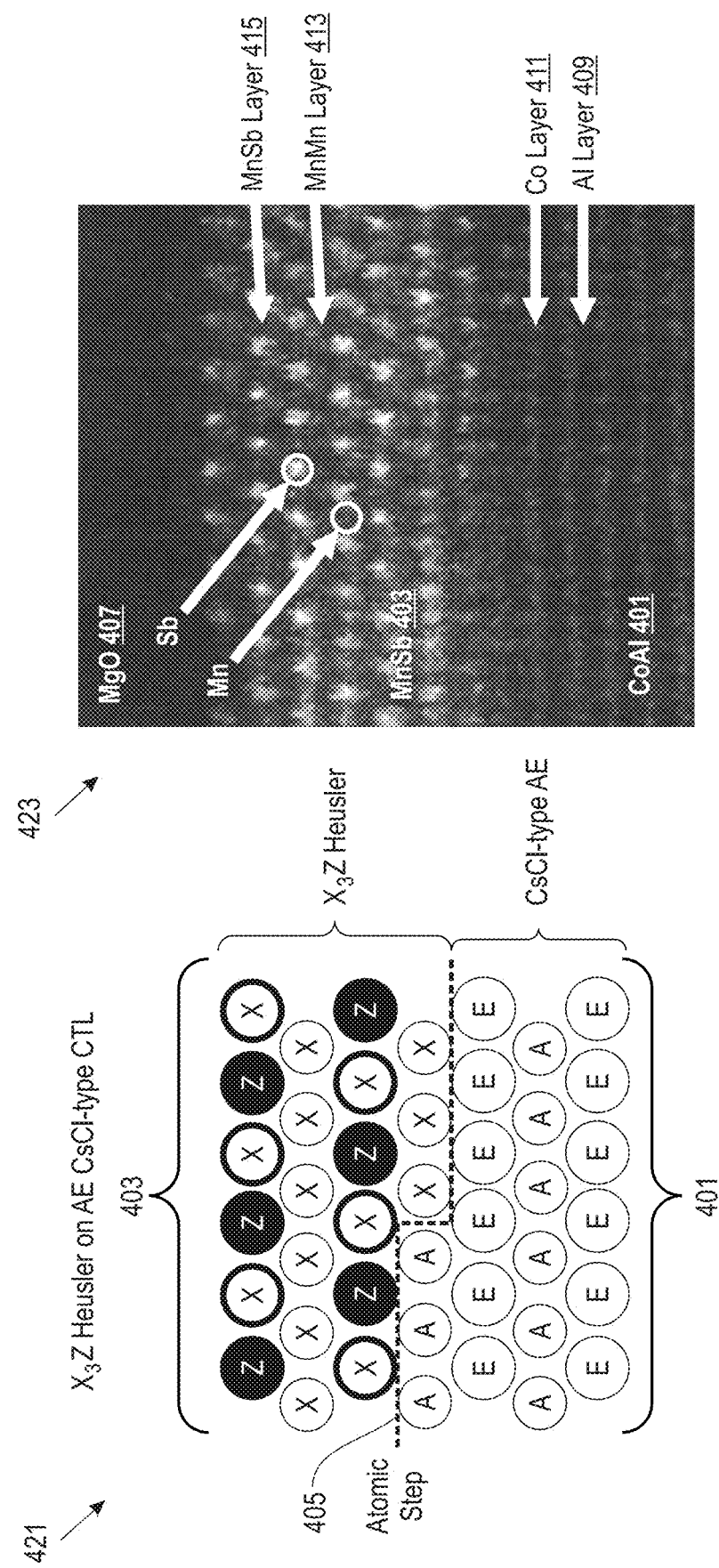
FIG. 2 shows growth of a Heusler compound on a templating layer according to aspects of the invention (also representative of growth of a half-Heusler compound on a templating layer according to aspects of the invention)

Referring now to FIG. 2, one or more embodiments employ a CsCl-type chemical templating layer (CTL) 401 (CoAl is an example of an excellent CsCl-type CTL) which promotes growth of an ordered Heusler compound even at ultrathin thicknesses and at room temperature. "E" can correspond, for example, to Al and "A" can correspond, for example, to Co. In FIG. 2, view 421 is a schematic while view 423 is a transmission electron microscopy (TEM) image. In the example of FIG. 2, a full Heusler compound such as $Mn_3Sb$ 403 grows epitaxially on top of the CoAl layer 401; however, the example is equally valid for half-Heusler materials (as described earlier they have an alternating layer structure with one layer containing transition metal atoms and the other containing transition metal and main group atoms). The in-plane lattice constant of the ultrathin (<~25 Å) full Heusler compound is similar to that of the CoAl CTL. It is possible to strain the full Heusler (or a half-Heusler) to a differing extent with an appropriate choice of CTL. We have found that even ternary full Heusler or half-Heusler compounds can be ordered by the CTL. As illustrated, the Mn (generally, X) grows on the Al and the Ge (generally, Z) grows on the Co. Note the atomic step 405. The full Heusler (or half-Heusler) material can be strained and thus adopts the in-plane lattice constant of the template material. One or more embodiments impose the lattice constant of the templating layer onto the Heusler (or half-Heusler) layer. In view 423, note that CoAl 401 includes Al layers 409 and Co layers 411 and the MnSb includes MnMn layer 413 and MnSb layer 415. Note the MgO tunnel barrier 407.

We examined one hundred fifty cubic half-Heusler compounds claimed in the literature (theoretically) to be half metallic (HM). We used both the DFT/GGA (Generalized Gradient Approximation) and DFT/LDA (Local Density Approximation) methods, as appropriate, in our calculations, and found that some of these compounds are indeed HM, some are not HM but have large spin polarization, and some are not HM and have relatively small spin polarization. In particular, from the one hundred fifty compounds that were studied, as depicted in FIGS. 3A, 3B, and 3C, note 58 compounds with spin polarization=100% (true half metals), 51 compounds that are ferromagnetic, 25 compounds that exhibit PMA, and 19 compounds that stay half metallic when the in-plane lattice constant, a, is changed by 0.50 Å in the vicinity of the corresponding cubic lattice constant, $a_{cub}$. These compounds have very stable half metallicity that is difficult to destroy by variation of the lattice constant within 10% near $a_{cub}$. In FIGS. 3A, 3B, and 3C, the first column lists relevant half metallic Heusler compounds. All compounds presented in the FIG. 3 are ferromagnetic except seven ferrimagnetic compounds: CoCrGe, CoMnGe, MnMnAs, FeCrAs, RuCrAs, CoCrAs, and MnVAs. The second column lists the $a_c$ parameter defined as $a_c=a_{cub}/\sqrt{2}$. If this $a_c$ value can be changed by, say, +/-0.3 Ås or +/-10% and the compound still stay half metallic, then the compound is considered as exhibiting robust half metallicity, and can likely be grown on a templating layer to achieve tetragonality without losing half metallicity. The third column shows the total moment $m_{tot}$. This stays unchanged when the in-plane lattice constant changes within the half-metallicity range. The fourth column shows $E_{gap}$, which is the value of the band gap. The fifth column lists Tc, which is the Curie temperature calculated for the ground state cubic structure of half-metallic half-Heuslers. Columns six and seven list $a_{min}$ and $a_{max}$, which are the minimum and maximum values of the in-plane lattice constant, a, for which the tetragonally distorted compound is half-metallic (as mentioned above, when a changes between $a_{min}$ and $a_{max}$, the total magnetic moment of the compound does not change). The eighth column includes $w_{hm}$, which equals $a_{max}-a_{min}$, the width of the half-metallic range. The ninth and tenth columns include $a_{opt}$ and $c'_{opt}$, which are the optimal in-plane lattice constant and corresponding dimensionless out-of-plane lattice constant, $c'_{opt}=c_{opt}/(2a_{opt})$, that provide the largest volume magnetic anisotropy constant $K_v$ for a in the half-metallicity range ($a_{min} \leq a_{opt} \leq a_{max}$). Here, $c_{opt}$ is the optimal out-of-plane lattice constant c shown in FIG. 4. The eleventh column shows $K_v$, which is the volume magnetic anisotropy constant calculated for the optimal lattice constant, $a_{opt}$. The table shown on FIGS. 3A, 3B, and 3C only includes compounds that have PMA ($K_v>0$). The last column lists spin polarization, SP, and is 1.00 for all compounds included in FIGS. 3A, 3B, and 3C, since they are half-metals. In FIGS. 3A, 3B, and 3C, compounds are ordered by the width of the half-metallic range, $w_{hm}$, since the larger $w_{hm}$ and the band gap, $E_{gap}$, the more stable are the half-metallic properties of a compound with respect to various effects (change of the in-plane and out-of-plane lattice constants, details of the computational method, chosen DFT functional, finite temperature effects, impurities, dislocations, etc.).

We identified fifty-six compounds that stay half metallic when a is changed by as much as 0.30 Å in the vicinity of $a_{cub}$ (all these compounds are highlighted in the eighth column of FIGS. 3A-3C). These compounds have very stable half metallicity that is difficult to destroy by variation (in each direction) of the lattice constant within 10% near $a_{cub}$. Our calculations indicate that the most promising candidates for an electrode in an MRAM device are NaCsP, LiCaGe, LiSrGe, NaCaGe, KCaGe, RbTaGe, KCrTe, NaCaSn, KTaSn, KCaSn, RbNbSi, RbTaSi, NaCsAs, CsRbAs, CsBaC, CsSrC, CsRbN, RhFeGe, RhCrGe, CoCrGe, RhFeSn, NiVSn, RuCrAs, CoCrAs, and CsSrSn, which have 100% spin polarization and PMA with an anisotropy constant $K_v >= 0.19$ MJ/m³ at the optimal in-plane lattice constant. The chemical ordering in RhFeGe, RhCrGe, CoCrGe, RhFeSn, NiVSn, RuCrAs, and CoCrAs, which contain transition elements and a main group element, by chemical templating layer, is described in FIG. 2. The other listed compounds contain another metal atom, or in some cases two metal atoms, instead of transition metal atom(s) along with a main group element atom. The chemical templating layer should also promote chemical ordering in these set(s) of compounds.

It will be appreciated that it is appropriate for $K_v$ to be greater than zero, and higher values are better. Hence, the table highlights all $K_v$ values which are ≥0.19 MJ/m³. In one or more embodiments the spin polarization SP=1.

Figure 6:
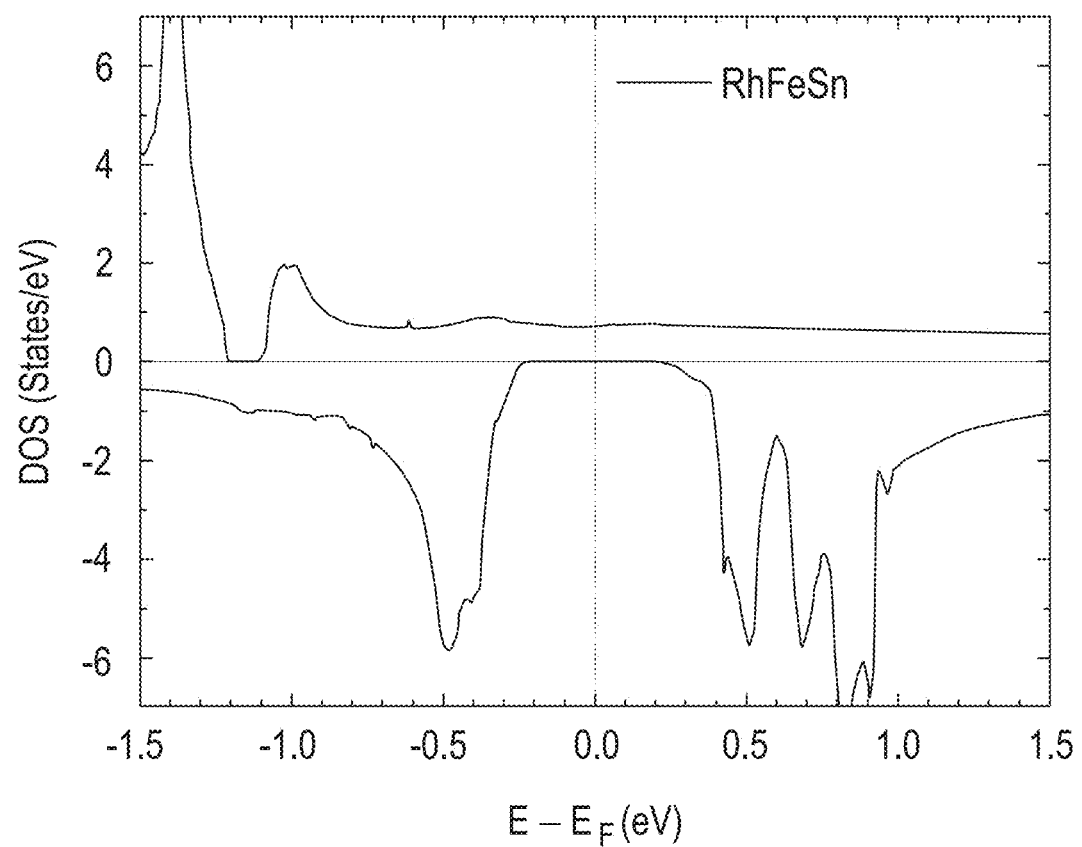
FIGS. 6 and 7 respectively depict density of state (DOS) for the two compounds described in FIGS. 4 and 5.
Figure 7:
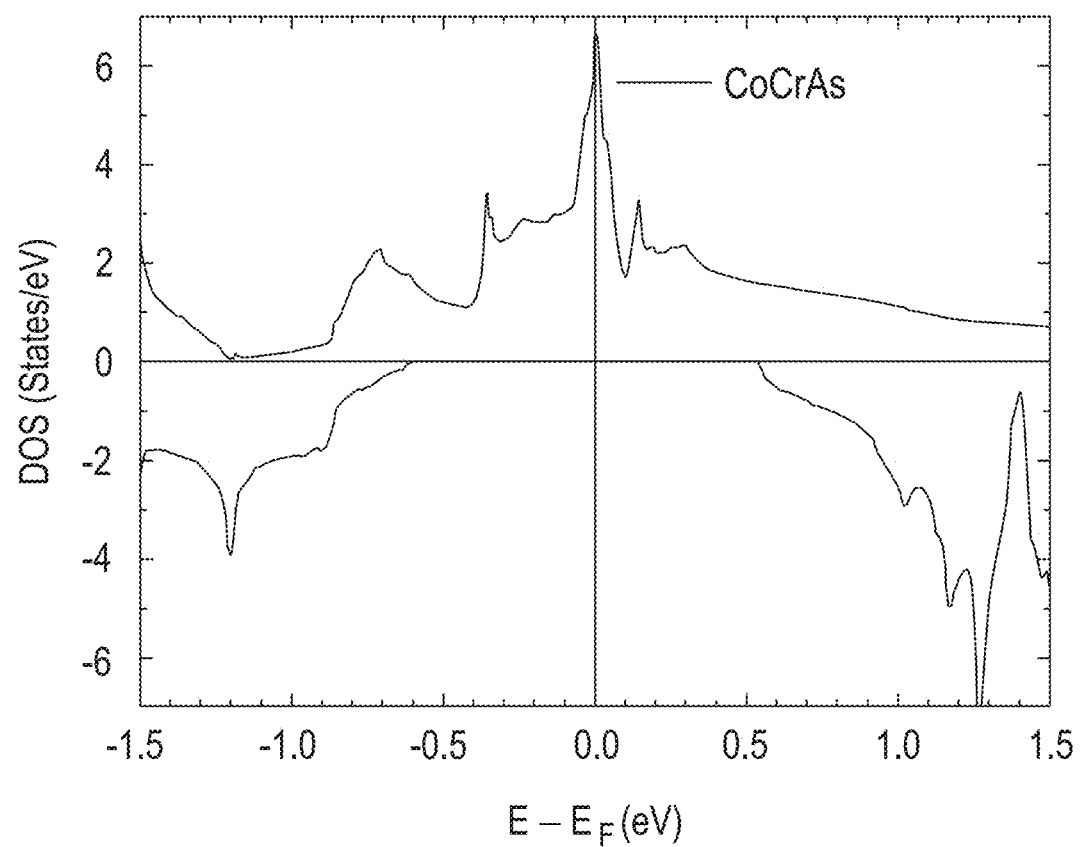

Refer now to FIGS. 4 and 5. FIG. 4 shows RhFeSn, which is an example of a ferromagnetic half metallic half Heusler. In FIG. 4, note vacancy 601, Fe 602, Sn 604, and Rh 605. FIG. 5 shows CoCrAs, which is an example of ferrimagnetic half metallic half Heusler. In FIG. 5, note vacancy 601, Cr 612, As 613, and Co 611. In FIG. 4 and FIG. 5, the arrows represent the magnetic moment on individual atoms. Tetragonal unit cells shown in FIG. 4 and FIG. 5 are rotated 45° around the z-axis relative to the parent cubic structure shown in FIG. 1. (Note that only some of the atoms from FIG. 1 are shown in FIG. 4 and FIG. 5.) The lattice constant $a_{cub}$ of the cubic half-Heusler material is shown in FIG. 1 and the lattice constants a and c of the tetragonal half-Heusler material are shown in FIG. 4. For the cubic structure, the relation of the in-plane lattice constant, a, shown in FIG. 4 and $a_{cub}$ shown in FIG. 1 is $a_c=a_{cub}/\sqrt{2}$. For characterization of the tetragonal unit cell, we use the dimensionless parameter c'=c/(2a) that is equal to $1/\sqrt{2}\approx0.707$ for the cubic structure. FIG. 6 and FIG. 7 show density of state (DOS) for the two compounds described in FIG. 4 and FIG. 5. For both these compounds, there is a significant minority band gap at the Fermi level. FIG. 6 and FIG. 7 plot DOS in states per electron volt versus $E-E_F$ in electron volts.

As noted, the tetragonal case can be produced via growth on a suitable templating layer. By way of review, in a templating concept a templating layer is grown and another layer (e.g., Heusler or half-Heusler compound) is grown on top of it. Templating essentially means that the layer being grown on the templating layer grows to the lattice constant a of the underlayer/seed layer. Analogously to Poisson's ratio, changing a also changes c; if a shrinks, c increases (and the opposite, if a grows, c shrinks). Since the lattice constant a for the half metallic half-Heusler layer is larger than the lattice constant for the templating layer (an), the templating layer rotates by 45° to lattice match the half metallic half-Heusler layer. Referring to FIG. 9, we define $a_{TL}'$ to be Sqrt(2)*$a_{TL}$ for the following discussion. Consider half metallic half-Heusler, CoCrAs grown on a CoAl templating layer. Since a goes from 3.57 Å in the cubic form down to 4.04 Å in the tetragonal form, c decreases. The material seeks to conserve its unit cell volume. Referring again to FIG. 2, CoAl is a layered structure. In the Heusler compound 403 (also representative of a half-Heusler), the all-Mn layer, because it contains only a transition metal, prefers to grow on the Al of the templating layer, while the MnSb layer, because it also has a main group element, prefers to grow on the Co, and thus ordering is obtained in the material 403. Atomic steps 405 are inherent in the templating layer 401 but do not disturb the ordering in the Heusler material 403 (also representative of a half-Heusler).

FIG. 8 shows half metallic half Heusler compounds with optimum in-plane lattice constant for high PMA. Note that FIG. 8 reproduces portions of FIGS. 3A-3C for a selected list of compounds with strong PMA ($K_v \geq 0.19$ MJ/m$^3$); note also that FIG. 8 includes CoCrGe with $K_v=0.2$ MJ/m$^3$ instead of $K_v=0.19$ MJ/m$^3$ as listed in FIG. 3B due to rounding. Note that for all these compounds, $E_g>0.4$ eV and $w_{hm} \geq 0.34$ Å, with the exception of RhFeGe, which has $w_{hm}=0.20$ Å. Thus, these compounds have robust half-metallicity.

FIG. 9 shows candidate CTL materials. Note that $a_{TL}$, the in-plane lattice constant, for several CTL materials, can be tuned over a large range of values. These "$a_{TL}$" values can also be adjusted further with strain induced from the underlying seed layer and/or via a change in composition from the nominal 1:1 value. Different lattice constants can be "mixed and matched" in one or more embodiments. Further regarding "mix and match," note, for example, that CoAl has a lattice constant of 2.86 Å while RuAl has a lattice constant of 2.95 Å. In principle, if the half-Heusler compound is grown on the RuAl, the half-Heusler compound will try to conform to the RuAl lattice constant, and thus will be stretched differently than if grown on CoAl. That is to say, the degree of tetragonal elongation depends on what substrate the tetragonal half-Heusler material is grown on.

Figure 10:
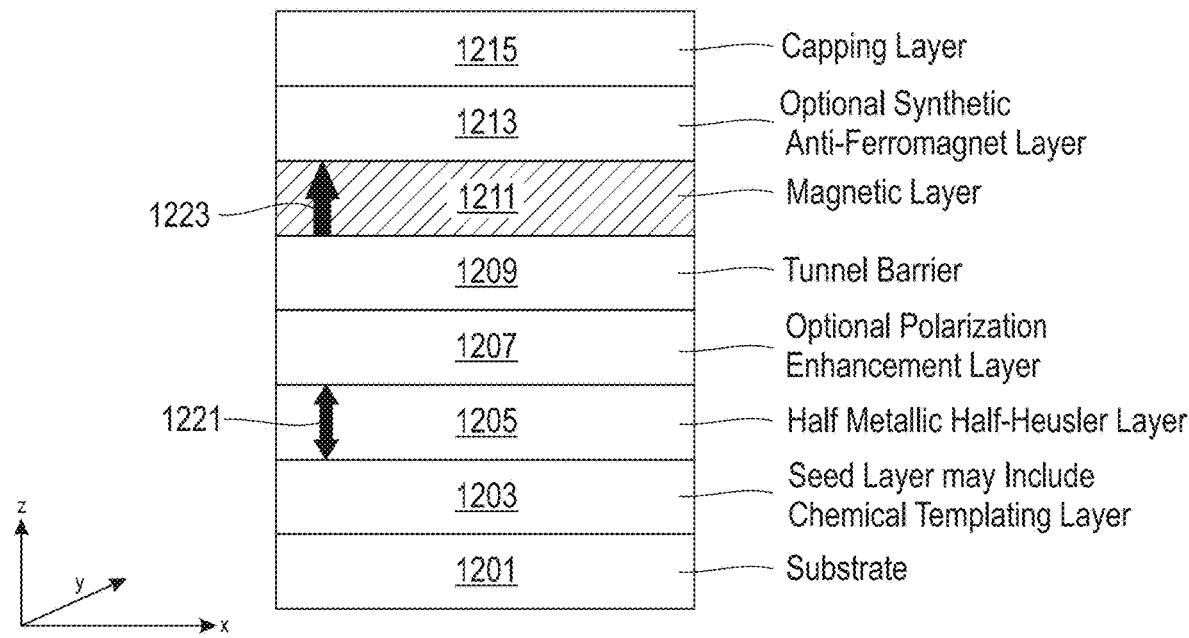
FIG. 10 shows a first exemplary MRAM cell, according to an aspect of the invention.

FIG. 10 shows an embodiment with a half metallic half-Heusler compound as a storage layer 1205. The seed layer 1203 will typically include the CTL, and is located on substrate 1201. Substrate 1201 is typically silicon with CMOS circuitry such as transistors and access lines permitting selection of individual devices. Other than the novel cells described herein, conventional transistors, access lines, peripheral circuits, and the like can be employed—refer to discussion of FIG. 12 below. The CTL or even a multilayer of CTLs can be grown on a suitable surface such as directly on the substrate if possible, or more typically on a seed layer deposited on the substrate. Non-limiting examples of seed layers include tantalum, tantalum-ruthenium, chromium, manganese, manganese nitride or the like. Half metallic half-Heusler layer 1205 is located on the CTL, and can be formed, for example, by epitaxial growth on the CTL. Polarization enhancement layer 1207 is optionally located outward of layer 1205; layer 1207, where present, can include, for example, a thin layer of magnetic material such as cobalt. Tunnel barrier 1209 is located outward of layer 1207 (where present), else outward of layer 1205; barrier 1209 can include, for example, MgO, MgAl$_2$O$_4$, or the like. Magnetic layer 1211 includes conventional cobalt, iron, nickel, or alloys, or could also include Heusler or half-Heusler materials. Synthetic anti-ferromagnet (SAF) layer 1213, where present, is located outward of layer 1211. Typically a Synthetic Anti-Ferromagnet (SAF) layer includes a Co/Pt multilayer (not shown) that is magnetically coupled to the underlying magnetic layer to achieve needed performance. A thin layer (not shown) of Ta or Ir or Ru (order of few A) may typically be interposed between the magnetic layer and the SAF layer. Cap layer 1215 is located outward of layer 1213 (where present), else outward of layer 1211. The cap layer may include Mo, W, Ta, Pt, Ru, or a combination thereof. In FIG. 10, double-headed arrow 1221 indicates the storage layer wherein the magnetization can be changed, while single-headed arrow 1223 indicates the reference layer with constant/fixed magnetization.

Figure 11:
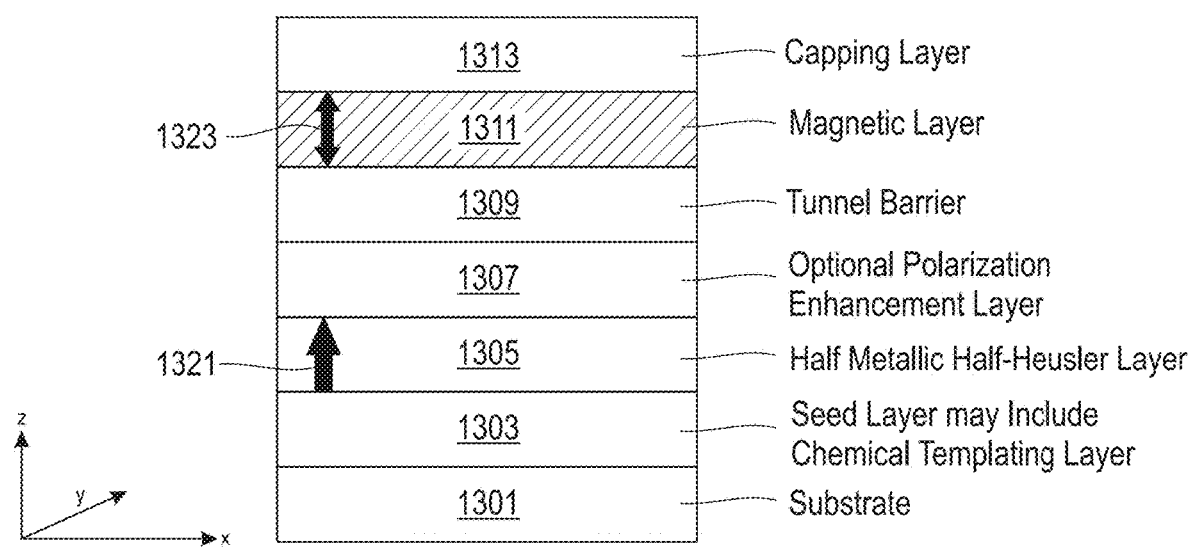
FIG. 11 shows a second exemplary MRAM cell, according to an aspect of the invention.

FIG. 11 shows an embodiment with a half metallic half-Heusler compound as a reference layer. The seed layer 1303 will typically include the CTL, and is located on substrate 1301. Half metallic half-Heusler layer 1305 is located on the CTL, and can be formed, for example, by epitaxial growth on the CTL. Polarization enhancement layer 1307 is optionally located outward of layer 1305. Tunnel barrier 1309 is located outward of layer 1307 (where present), else outward of layer 1305. Magnetic layer 1311 includes conventional cobalt, iron, nickel, or alloys, or could also include Heusler or half-Heusler materials. Cap layer 1313 is located outward of layer 1311. In FIG. 11, double-headed arrow 1323 indicates the storage layer wherein the magnetization can be changed, while single-headed arrow 1321 indicates the reference layer with constant/fixed magnetization. The comments regarding materials in FIG. 10 are generally applicable to FIG. 11 as well.

In both FIG. 10 and FIG. 11, the half-Heusler layer is typically located on top of the templating layer, due to the epitaxial growth in the fabrication process.

We have thus identified forty five half metallic half-Heusler compounds with PMA which stay half metallic even upon applying significant in-plane lattice strain of almost ~10% (strain is varied by as much as 0.50 Å in the vicinity of $a_{cub}$). These compounds are KCrTe, NaCsP, NaCsAs, CsRbAs, CsRbN, NaKP, CsRbP, KCaGe, RbCrTe, CsBaC, LiSrGe, RbSrGe, KCaSn, KCaSi, NaVSi, RbSrSi, RbSrB, NaCaGe, KSrB, KTaSn, RbTaGe, CsSrSn, CsVS, RbSrC, CsSrC, RbTaSi, KBaB, CoVSb, RbNbSn, RbNbSi, KMgGe, MnMnAs, RbCaB, CsSrGe, CoCrAs, LiBaGe, CoCrSb, NaCaSn, CoCrGe, RhVAs, CsNbSn, CsNbSi, CsNbGe, NiMnSi, and RhCrGe. These compounds have a very stable half metallicity that is difficult to destroy by variation (in each direction) of the lattice constant. Experimentally, such strain can be achieved by epitaxial growth of these compounds on CTLs such as CoAl.

Our calculations indicate that the most promising candidates for an electrode in an MRAM device are KCrTe, NaCsP, NaCsAs, CsRbAs, KCaGe, CsBaC, LiSrGe, KCaSn, NaCaGe, KTaSn, RbTaGe, CsSrC, RbTaSi, RbNbSi, CoCrAs, NaCaSn, RhCrGe, LiCaGe, RhFeSn, NiVSn, CsRbN, RhFeGe, CoCrGe, RuCrAs, and CsSrSn, which have 100% spin polarization and PMA with an anisotropy constant $K_v \geq 0.19$ MJ/m$^3$ at optimal in-plane lattice constant. Twenty-three of these twenty-five compounds are ferromagnetic. Twenty-one of these twenty-five compounds have stable half metallicity that is difficult to destroy by variation of the lattice constant (strain can be varied by as much as 0.50 Å in the vicinity of $a_{cub}$). Sixteen of these twenty-five compounds have a low moment (m=1.0$\mu_B$/form_unit) on a par with that of Mn$_3$Ge (m=1.0$\mu_B$/form_unit where form_unit. stands for "formula unit").

One or more embodiments thus include a device, the device in turn includes a multi-layered structure (e.g., FIGS. 10 and 11). The multi-layered structure includes a first layer, which is non-magnetic at room temperature, including a binary alloy with a CsCl structure having a target in-plane lattice constant (e.g., CTL of 1203, 1303). Also included is a second layer 1205, 1305 with a half metallic half-Heusler compound whose magnetization is substantially perpendicular to the layer. As will be appreciated by the skilled artisan, typically, the magnetization is not fixed, but rather, the magnetization precesses like a spinning top at a non-zero temperature. This can change depending on temperature. In view of this precession, perpendicularity, as used herein, refers to perpendicularity of the time integral/average of the path of the magnetization. The time integral/average of the path of the magnetization could be, for example, "exactly" perpendicular, perpendicular within =/−5%, or perpendicular within +/−10%.

In some cases, the half metallic half-Heusler compound is selected from the group consisting of RhCrGe, RhFeSn, CoCrGe, NiVSn, CoCrAs, RhFeGe, or RuCrAs; in some such cases, the half metallic half-Heusler layer has, for example, a thickness of less than 5 nm. In some such cases, the templating layer or chemical templating layer which is a binary alloy is represented by $A_{1-x}E_x$, wherein A is a transition metal element and E is a main group element. For example, A includes Co and E includes at least aluminum or gallium and possibly traces of other elements (e.g., Al or Ga; or Al alloyed with Ga, Ge, Sn, or any combination thereof, such as AlSn, AlGe, AlGaGe, AlGaSn, AlGeSn, and AlGaGeSn), and x is in the range from 0.42 to 0.55. In some such cases, a tunnel barrier 1209, 1309 is located in contact with the half metallic half-Heusler layer; the tunnel barrier can include, for example, MgO (magnesium aluminum oxide is a suitable alternative to MgO with magnesium aluminum oxide having the form $Mg_{1-z}Al_{2+(2/3)z}O_4$, wherein −0.5<z<0.5).

In one or more embodiments, the half metallic half-Heusler compound is selected from the group consisting of KCrTe, NaCsP, NaCsAs, CsRbAs, KCaGe, CsBaC, LiSrGe, KCaSn, NaCaGe, KTaSn, RbTaGe, CsSrC, RbTaSi, RbNbSi, CoCrAs, NaCaSn, RhCrGe, LiCaGe, RhFeSn, NiVSn, CsRbN, RhFeGe, CoCrGe, RuCrAs and CsSrSn; the half metallic half-Heusler layer has, for example, a thickness of less than 5 nm; in some such cases, the templating layer or chemical templating layer which is a binary alloy is represented by $A_{1-x}E_x$, wherein A is a transition metal element and E is a main group element. For example, A includes Co and E includes at least aluminum or gallium and possibly traces of other elements, and x is in the range from 0.42 to 0.55, as discussed above. In some such cases, a tunnel barrier 1209, 1309 is located in contact with the half metallic half-Heusler layer; the tunnel barrier can include, for example, MgO (magnesium aluminum oxide is a suitable alternative to MgO).

It should be noted that the half metallic half-Heusler compounds are indicated by stoichiometric formulas and this does not preclude small variations of up to several % from the nominal values. The templating layers could include any of the materials listed in FIG. 9 but are not limited to those materials.

Figure 12:
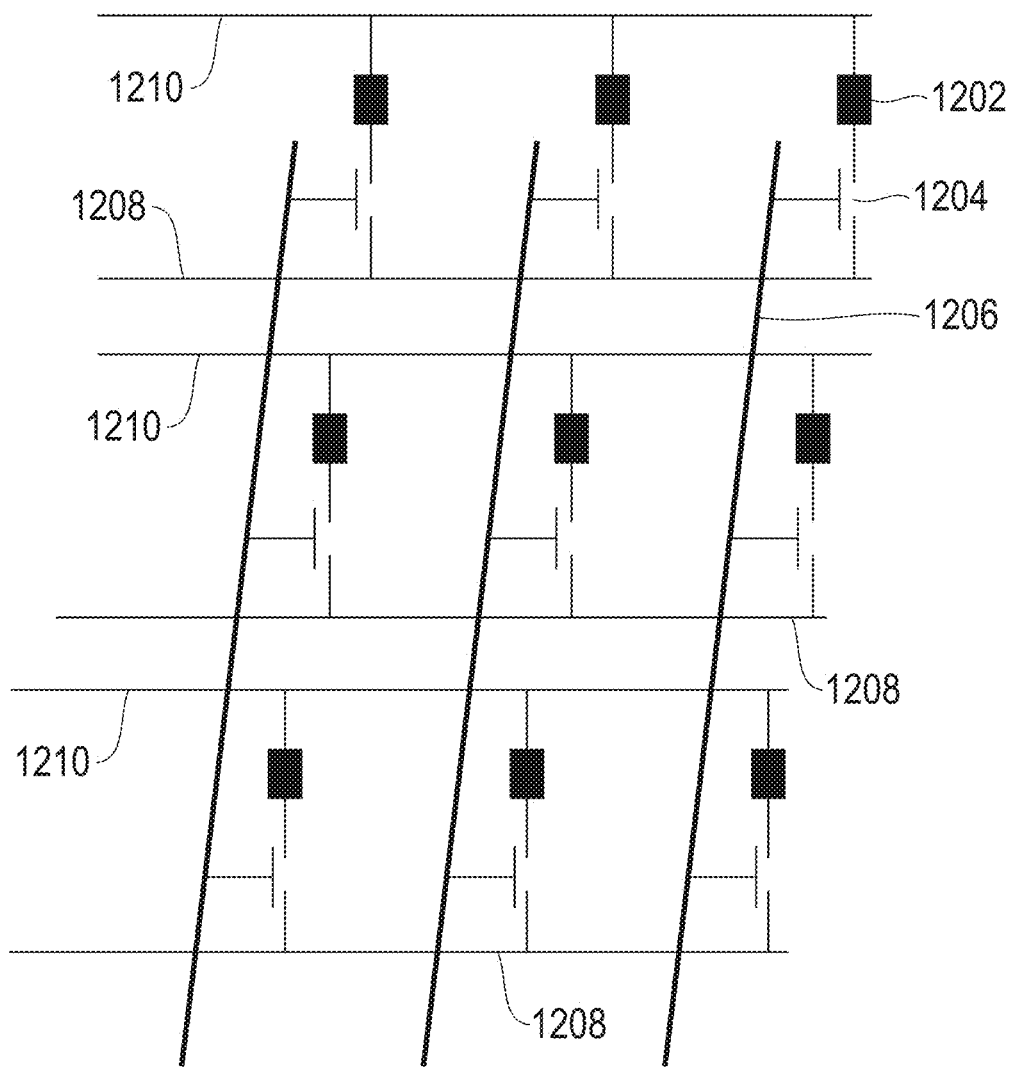
FIG. 12 shows an array of MRAM cells, according to an aspect of the invention.

Referring now to FIG. 12, an array of MRAM devices 1202 is shown. Each cell 1202 (e.g., embodiment of FIG. 10 or FIG. 11) is connected to a respective transistor 1204 that controls reading and writing. A word line 1206 provides data to write to the cells 1202, while a bit line 1210 and a bit line complement 1208 read data from the cell 1202. In this manner, a large array of memory devices can be implemented on a single chip. An arbitrarily large number of cells 1202 can be employed, within the limits of the manufacturing processes and design specifications.

Writing data to a cell 1202 includes passing a current through the cell. This current causes the direction of magnetization to switch between a parallel or anti-parallel state, which has the effect of switching between low resistance and high resistance. Because this effect can be used to represent the 1s and 0s of digital information, the cells 1202 can be used as a non-volatile memory. Passing the current in one direction through the cell 1202 causes the magnetization of the free layer 1205, 1311 to be parallel with that of the reference layer 1211, 1305, while passing the current in the other direction through the cell 1202 causes the magnetization of the free layer 1205, 1311 to be antiparallel to that of the reference layer 1211, 1305. Reading the bit stored in a cell 1202 involves applying a voltage (lower than that used for writing information) to the cell 1202 to discover whether the cell offers high resistance to current ("1") or low resistance ("0").

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, ion milling, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method, including the epitaxial growth of the half-metallic half-Heusler material on the templating layer, and the structures formed thereby, are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1$^{st}$ *Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, an exemplary magnetoresistive random-access memory cell includes a templating layer (e.g., part of 1203 or 1303) including a binary alloy (e.g., 401) having an alternating layer lattice structure. Also included is a half metallic half-Heusler layer 1205, 1305 including a half metallic half-Heusler material (e.g., 403) having a tetragonal lattice structure. The half metallic half-Heusler layer is located outward of the templating layer, and has a half-Heusler in-plane lattice constant that is different from an in-plane lattice constant in a cubic form of the half metallic half-Heusler material. Refer to the discussion of FIGS. 4 and 5. The cell further includes a tunnel barrier 1209, 1309 outward of the half metallic half-Heusler layer, and a magnetic layer 1211, 1311 outward of the tunnel barrier. The magnetic layer can be a conventional material or a Heusler or half-Heusler material, for example.

Referring specifically to FIG. 10, in some instances, the half metallic half-Heusler layer 1205 includes a storage layer, and the magnetic layer 1211 includes a reference layer. On the other hand, referring specifically to FIG. 11, in some instances, the half metallic half-Heusler layer 1305 includes a reference layer, and the magnetic layer 1311 includes a storage layer.

The half metallic half-Heusler compound can be selected from the group consisting of KCrTe, NaCsP, NaCsAs, CsRbAs, KCaGe, CsBaC, LiSrGe, KCaSn, NaCaGe, KTaSn, RbTaGe, CsSrC, RbTaSi, RbNbSi, CoCrAs, NaCaSn, RhCrGe, LiCaGe, RhFeSn, NiVSn, CsRbN, RhFeGe, CoCrGe, RuCrAs and CsSrSn. In some cases, the half metallic half-Heusler layer has a thickness of less than 5 nm. An exemplary material stack for FIG. 10 could be Si substrate/50 Å Ta/3 Å Co$_{20}$Fe$_{60}$B$_{20}$/200 Å Mn$_3$N/300 Å CoAl/14 Å RhFeGe/12 Å MgO/11 Å Co$_{20}$Fe$_{60}$B$_{20}$/3 Å Ta/[2.5 Å Co/5 Å Pt]$_2$/5 Å Co/9 Å Ru/5 Å Co/5 Å Pt/[2.5 Å Co/5 Å Pt]$_4$/5 Å Pt/100 Å Ru. An exemplary material stack for FIG. 11 could be Si substrate/50 Å Ta/3 Å Co$_{20}$Fe$_{60}$B$_{20}$/ 200 Å Mn$_3$N/300 Å CoAl/25 Å Mn$_2$FeSb/12 Å MgO/11 Å Co$_{20}$Fe$_{60}$B$_{20}$/100 Å Ru.

In some instances, the half metallic half-Heusler compound is selected from the group consisting of RhCrGe, RhFeSn, CoCrGe, NiVSn, CoCrAs, RhFeGe, or RuCrAs; here again, in some cases, the half metallic half-Heusler layer has a thickness of less than 5 nm.

In one or more embodiments, the tunnel barrier 1209, 1309 is selected from the group consisting of magnesium oxide and magnesium aluminum oxide.

In one or more embodiments, the binary alloy of the templating layer is represented by the formula $A_{1-x}E_x$, wherein A is a transition metal element and E is a main group element including at least one of aluminum and gallium, and x is in the range from 0.42 to 0.55.

In some instances, the alternating layer lattice structure of the templating layer includes a cesium chloride structure.

In some instances, the templating layer is nonmagnetic at room temperature (i.e., 20 degrees C.).

In one or more embodiments, the templating layer has a templating layer in-plane lattice constant, and the half-Heusler in-plane lattice constant substantially matches the templating layer in-plane lattice constant. As used herein, the half-Heusler in-plane lattice constant "substantially matches" the templating layer in-plane lattice constant when it matches the templating layer in-plane lattice constant or when the in-plane lattice constant of the tetragonal half-Heusler material has moved towards the in-plane lattice constant of the templating material from the in-plane lattice constant of the cubic half-Heusler material. In some cases, the half-Heusler in-plane lattice constant matches the templating layer in-plane lattice constant within +/−10%. In some cases, the half-Heusler in-plane lattice constant matches the templating layer in-plane lattice constant within +/−5%. The half metallic half-Heusler material has, for example, a magnetization substantially perpendicular to the half metallic half-Heusler layer.

In another aspect, referring to FIG. 12, a magnetoresistive random-access memory array includes a plurality of bit lines 1210 and a plurality of complementary bit lines 1208 forming a plurality of bit line-complementary bit line pairs. A plurality of word lines 1206 intersect the plurality of bit line pairs at a plurality of cell locations. A plurality of magnetoresistive random-access memory cells 1202 are located at each of the plurality of cell locations. Each of the magnetoresistive random-access memory cells 1202 is electrically connected to a corresponding bit line 1210 and selectively interconnected to a corresponding one of the complementary bit lines 1208 under control of a corresponding one of the word lines 1206 (e.g., a respective transistor 1204 is a field effect transistor turned off or on by a signal from word line 1206 applied to its gate, which controls reading and writing and whether the cell is coupled to the complementary bit lines).

Each of the plurality of magnetoresistive random-access memory cells includes as in FIG. 10 or FIG. 11 a templating layer including a binary alloy having an alternating layer lattice structure; a half metallic half-Heusler layer including a half metallic half-Heusler material having a tetragonal lattice structure, the half metallic half-Heusler layer being located outward of the templating layer, and having a half-Heusler in-plane lattice constant that is different from an in-plane lattice constant in a cubic form of the half metallic half-Heusler material; a tunnel barrier outward of the half metallic half-Heusler layer; and a magnetic layer outward of the tunnel barrier, all as described elsewhere herein. Typically, the capping layer 1215 or 1313 of devices indicated in FIG. 10 and FIG. 11 connect to the bit line 1210 while the layer 1203 or 1303 connect to bit line complement 1208 through the access FET.

In still another aspect, an exemplary method of operation includes providing an array such as just described, applying signals to the word lines 1206 to cause a first subset of the cells 1202 to store logical ones and a second subset of the cells 1202 to store logical zeroes; and reading the stored logical ones and zeroes via the bit lines 1210 and the complementary bit lines 1208.

Figure 13:
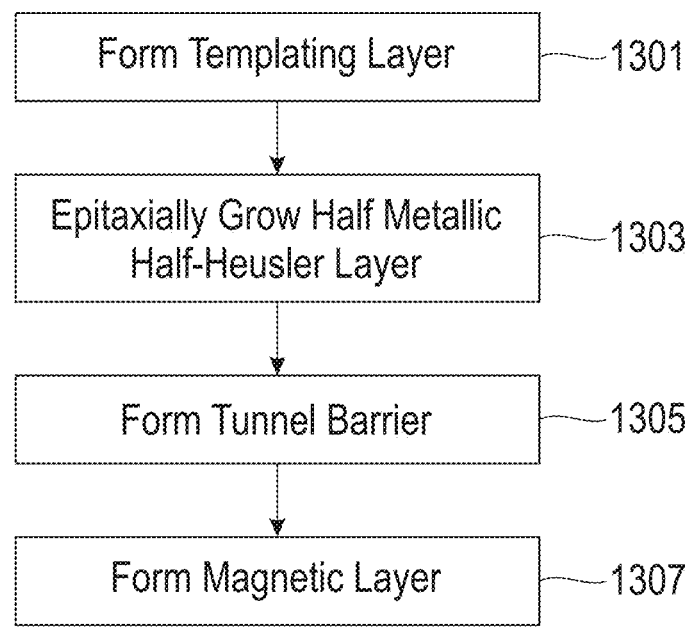
FIG. 13 shows a flow chart of a fabrication method, according to an aspect of the invention.

In yet another aspect, referring to FIG. 13, an exemplary method of forming a magnetoresistive random-access memory cell (such as in FIG. 10 or 11) includes, as per step 1301, providing a templating layer (e.g., part of 1203 or 1303, see layer 401 in FIG. 2). The templating layer includes a binary alloy having an alternating layer lattice structure and has a templating layer in-plane lattice constant. A further step 1303 includes epitaxially growing a half metallic half-Heusler layer (e.g., 1205 or 1305, see layer 403 in FIG. 2) on the templating layer. The half metallic half-Heusler layer includes a half metallic half-Heusler material. The half metallic half-Heusler layer is grown on the templating layer such that the half-Heusler material has a tetragonal lattice structure and a half-Heusler in-plane lattice constant that is different from the in-plane lattice constant in the cubic form of the half metallic half-Heusler material. The half-Heusler in-plane lattice constant substantially matches the templating layer in-plane lattice constant. Further steps include step 1305, forming a tunnel barrier (e.g., 1209 or 1309, see layer 407 in FIG. 2) outward of the half metallic half-Heusler layer; and step 1307, forming a magnetic layer 1211, 1311 outward of the tunnel barrier. The method can also include providing and/or forming other elements seen in FIGS. 10 and 11 using techniques apparent to the skilled artisan, given the teachings herein. The cells can be integrated into an array by forming a plurality of cells at the same time and interconnecting them with wires, transistors, and peripheral circuitry in a manner apparent to the skilled artisan, given the teachings herein.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from tetragonal half metallic half-Heusler compounds in MRAMs and the like.

An integrated circuit in accordance with aspects of the present inventions can be employed in essentially any application and/or electronic system where tetragonal half metallic half-Heusler compounds in MRAMs and the like would be beneficial. Given the teachings of the present disclosure provided herein, one of ordinary skill in the art will be able to contemplate other implementations and applications of embodiments disclosed herein.

Figure 14:
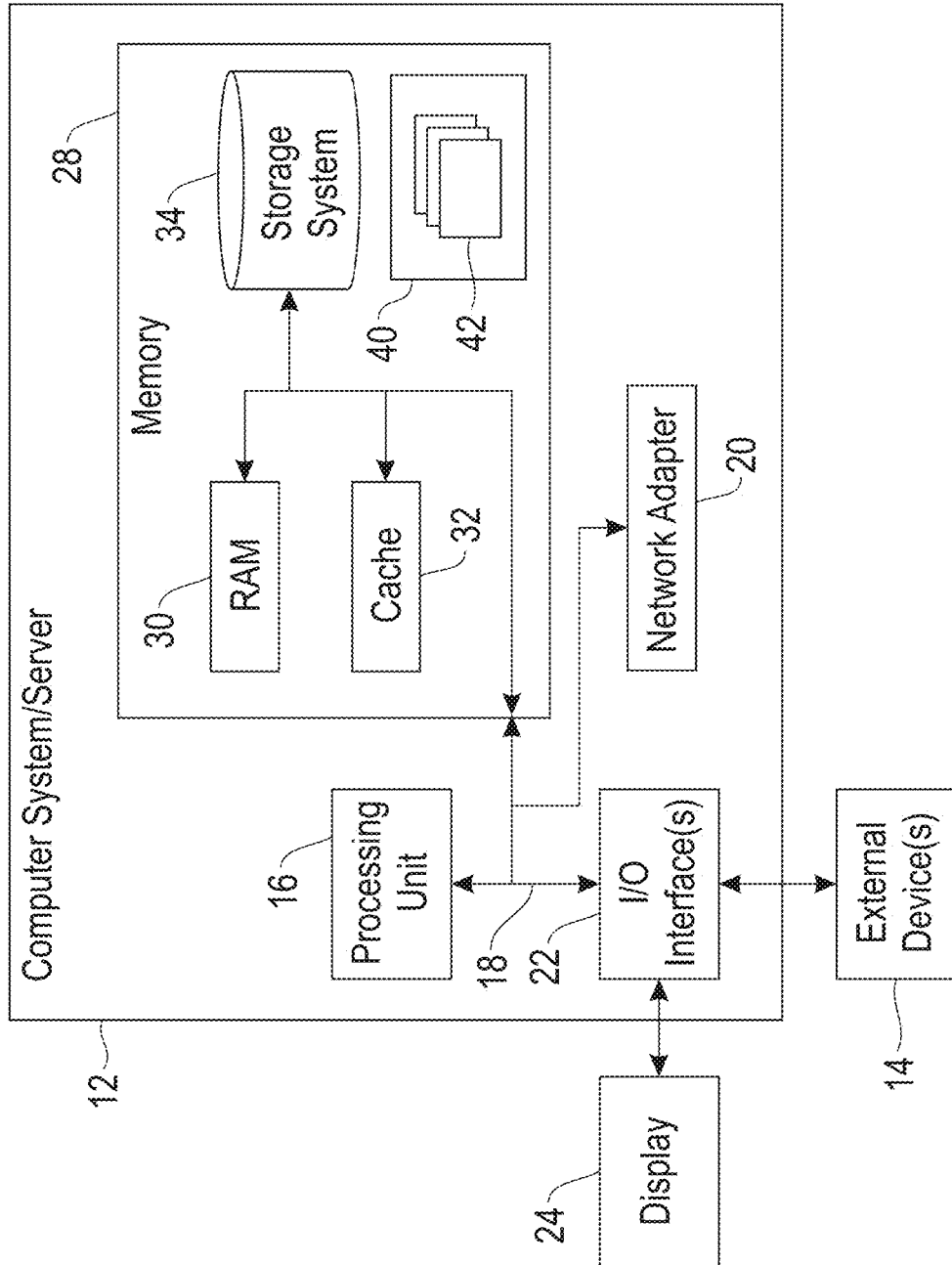
FIG. 14 depicts a computer system that may be useful in implementing one or more aspects and/or elements of the invention.

Some aspects of the invention, or elements thereof, can be implemented in the form of an apparatus including a memory and at least one processor that is coupled to the memory and operative to perform exemplary method steps. FIG. 14 depicts a computer system that may be useful in implementing one or more aspects and/or elements of the invention; it is referred to herein as a cloud computing node but is also representative of a server, general purpose-computer, etc. which may be provided in a cloud or locally. Note that such a computer can control semiconductor design and/or fabrication, and/or could use memory cells/arrays as described herein, for example.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 14, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, nonvolatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Thus, one or more embodiments can make use of software (e.g., for semiconductor design and/or fabrication) running on a general purpose computer or workstation. With reference to FIG. 14, such an implementation might employ, for example, a processor 16, a memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 14) running a server program. It will be understood that such a physical server may or may not include a display and keyboard.

Figure 15:
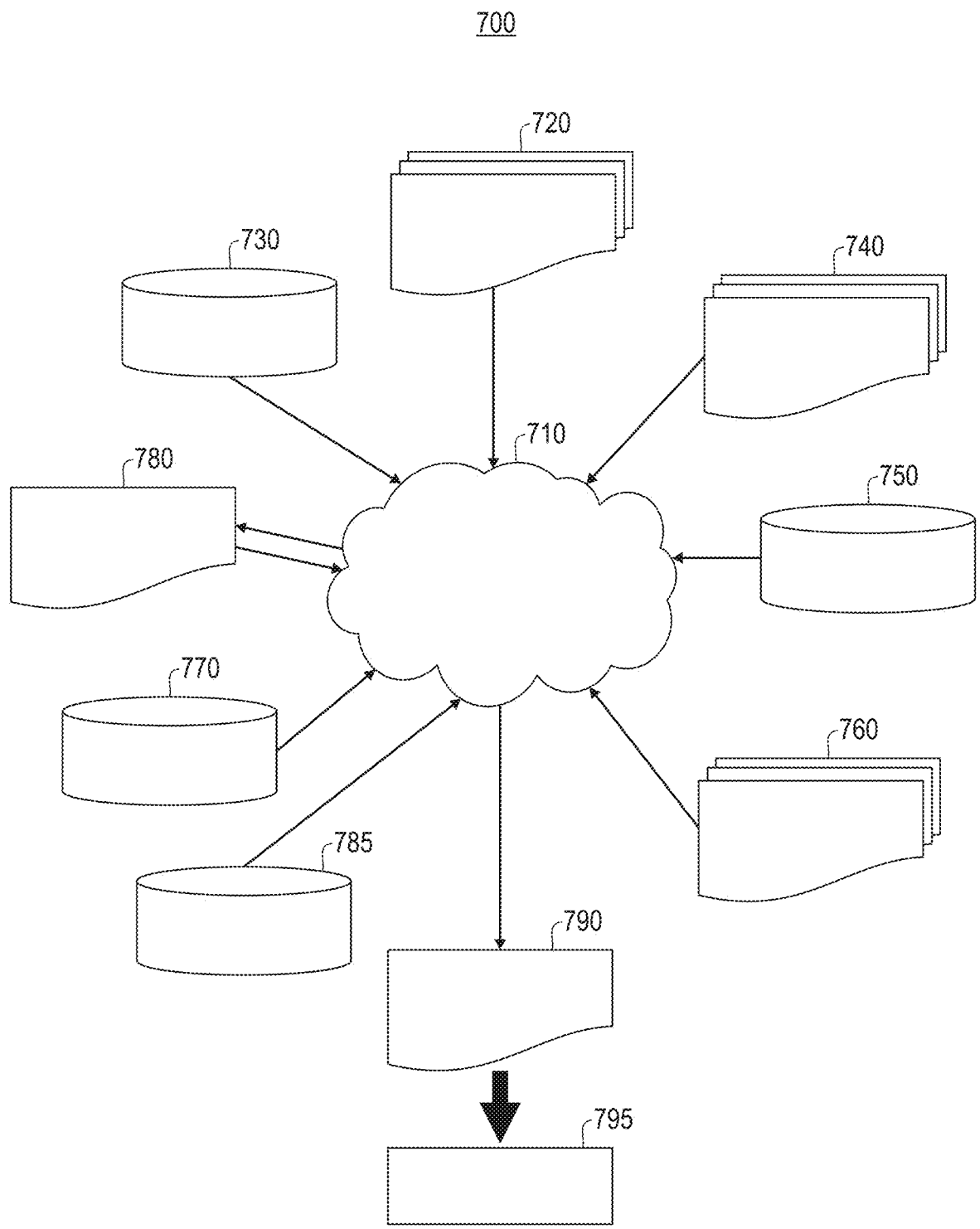
FIG. 15 is a flow diagram of a design process used in semiconductor design, manufacture, and/or test.

It should be noted that any of the methods described herein can include an additional step of providing a system comprising distinct software modules embodied on a computer readable storage medium; the modules can include, for example, any or all of the appropriate elements depicted in FIG. 15. The method steps can then be carried out using the distinct software modules and/or sub-modules of the system, as described herein, executing on one or more hardware processors such as 16. Further, a computer program product can include a computer-readable storage medium with code adapted to be implemented to carry out one or more method steps described herein, including the provision of the system with the distinct software modules. In one or more embodiments, the computer readable storage medium embodying code and/or design structure, is non-transitory.

One example of user interface that could be employed in some cases is hypertext markup language (HTML) code served out by a server or the like, to a browser of a computing device of a user. The HTML is parsed by the browser on the user's computing device to create a graphical user interface (GUI).

Exemplary Design Process Used in Semiconductor Design, Manufacture, and/or Test

One or more embodiments make use of computer-aided semiconductor integrated circuit design simulation, test, layout, and/or manufacture. In this regard, FIG. 15 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 790 may then proceed to a stage 795 where, for example, design structure 790: proceeds to tape-out, is released to manufacturing, is released to a mask house, is sent to another design house, is sent back to the customer, etc.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment (s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A magnetoresistive random-access memory cell, comprising:
    a templating layer comprising a binary alloy having an alternating layer lattice structure;
    a half metallic half-Heusler layer comprising a half metallic half-Heusler material having a tetragonal lattice structure, the half metallic half-Heusler layer being located outward of the templating layer, and having a half-Heusler in-plane lattice constant that is different from an in-plane lattice constant in a cubic form of the half metallic half-Heusler material;
    a tunnel barrier outward of the half metallic half-Heusler layer; and
    a magnetic layer outward of the tunnel barrier.

2. The magnetoresistive random-access memory cell of claim 1, wherein:
    the half metallic half-Heusler layer comprises a storage layer; and
    the magnetic layer comprises a reference layer.

3. The magnetoresistive random-access memory cell of claim 2, wherein the half metallic half-Heusler compound is selected from the group consisting of RhCrGe, RhFeSn, NiVSn, NaCsP, LiCaGe, LiSrGe, NaCaGe, KCaGe, RbTaGe, KCrTe, NaCaSn, KTaSn, KCaSn, RbNbSi, RbTaSi, NaCsAs, CsRbAs, CsBaC, CsSrC, CsRbN, RhFeGe, CoCrGe, RuCrAs, CoCrAs, and CsSrSn.

4. The magnetoresistive random-access memory cell of claim 3, wherein the half metallic half-Heusler layer has a thickness of less than 5 nm.

5. The magnetoresistive random-access memory cell of claim 3, wherein the half metallic half-Heusler compound is selected from the group consisting of RhCrGe, RhFeSn, CoCrGe, NiVSn, CoCrAs, RhFeGe, or RuCrAs.

6. The magnetoresistive random-access memory cell of claim 5, wherein the half metallic half-Heusler layer has a thickness of less than 5 nm.

7. The magnetoresistive random-access memory cell of claim 2, wherein the tunnel barrier is selected from the group consisting of magnesium oxide and magnesium aluminum oxide.

8. The magnetoresistive random-access memory cell of claim 2, wherein the binary alloy is represented by $A_{1-x}E_x$, wherein A is a transition metal element and E is a main group element including at least one of aluminum and gallium, and x is in the range from 0.42 to 0.55.

9. The magnetoresistive random-access memory cell of claim 1, wherein:
the half metallic half-Heusler layer comprises a reference layer; and
the magnetic layer comprises a storage layer.

10. The magnetoresistive random-access memory cell of claim 9, wherein the half metallic half-Heusler compound is selected from the group consisting of RhCrGe, RhFeSn, NiVSn, NaCsP, LiCaGe, LiSrGe, NaCaGe, KCaGe, RbTaGe, KCrTe, NaCaSn, KTaSn, KCaSn, RbNbSi, RbTaSi, NaCsAs, CsRbAs, CsBaC, CsSrC, CsRbN, RhFeGe, CoCrGe, RuCrAs, CoCrAs, CsSrSn.

11. The magnetoresistive random-access memory cell of claim 10, wherein the half metallic half-Heusler layer has a thickness of less than 5 nm.

12. The magnetoresistive random-access memory cell of claim 10, wherein the half metallic half-Heusler compound is selected from the group consisting of RhCrGe, RhFeSn, CoCrGe, NiVSn CoCrAs, RhFeGe, or RuCrAs.

13. The magnetoresistive random-access memory cell of claim 12, wherein the half metallic half-Heusler layer has a thickness of less than 5 nm.

14. The magnetoresistive random-access memory cell of claim 1, wherein the alternating layer lattice structure of the templating layer comprises a cesium chloride structure.

15. The magnetoresistive random-access memory cell of claim 1, wherein the templating layer is nonmagnetic at room temperature.

16. The magnetoresistive random-access memory cell of claim 1, wherein:
the templating layer has a templating layer in-plane lattice constant; and
the half-Heusler in-plane lattice constant substantially matches the templating layer in-plane lattice constant.

17. The magnetoresistive random-access memory cell of claim 16, wherein the half metallic half-Heusler material has magnetization substantially perpendicular to the half metallic half-Heusler material.

18. A magnetoresistive random-access memory array, comprising:
a plurality of bit lines and a plurality of complementary bit lines forming a plurality of bit line-complementary bit line pairs;
a plurality of word lines intersecting said plurality of bit line pairs at a plurality of cell locations;
a plurality of magnetoresistive random-access memory cells located at each of said plurality of cell locations, each of said magnetoresistive random-access memory cells being electrically connected to a corresponding bit line and selectively interconnected to a corresponding one of said complementary bit lines under control of a corresponding one of said word lines, each of said plurality of magnetoresistive random-access memory cells comprising:
a templating layer comprising a binary alloy having an alternating layer lattice structure;
a half metallic half-Heusler layer comprising a half metallic half-Heusler material having a tetragonal lattice structure, the half metallic half-Heusler layer being located outward of the templating layer, and having a half-Heusler in-plane lattice constant that is different from an in-plane lattice constant in a cubic form of the half metallic half-Heusler material;
a tunnel barrier outward of the half metallic half-Heusler layer; and
a magnetic layer outward of the tunnel barrier.

19. The magnetoresistive random-access memory array of claim 18, wherein:
the half metallic half-Heusler layer comprises a storage layer; and
the magnetic layer comprises a reference layer.

20. The magnetoresistive random-access memory array of claim 19, wherein the half metallic half-Heusler compound is selected from the group consisting of RhCrGe, RhFeSn, NiVSn, NaCsP, LiCaGe, LiSrGe, NaCaGe, KCaGe, RbTaGe, KCrTe, NaCaSn, KTaSn, KCaSn, RbNbSi, RbTaSi, NaCsAs, CsRbAs, CsBaC, CsSrC, CsRbN, RhFeGe, CoCrGe, RuCrAs, CoCrAs, and CsSrSn.

21. The magnetoresistive random-access memory array of claim 18, wherein:
the half metallic half-Heusler layer comprises a reference layer; and
the magnetic layer comprises a storage layer.

22. The magnetoresistive random-access memory array of claim 21, wherein the half metallic half-Heusler compound is selected from the group consisting of RhCrGe, RhFeSn, NiVSn, NaCsP, LiCaGe, LiSrGe, NaCaGe, KCaGe, RbTaGe, KCrTe, NaCaSn, KTaSn, KCaSn, RbNbSi, RbTaSi, NaCsAs, CsRbAs, CsBaC, CsSrC, CsRbN, RhFeGe, CoCrGe, RuCrAs, CoCrAs, and CsSrSn.

23. A method of operating a magnetoresistive random-access memory array, comprising:
providing a magnetoresistive random-access memory array, said array comprising:
a plurality of bit lines and a plurality of complementary bit lines forming a plurality of bit line-complementary bit line pairs;
a plurality of word lines intersecting said plurality of bit line pairs at a plurality of cell locations;
a plurality of magnetoresistive random-access memory cells located at each of said plurality of cell locations, each of said magnetoresistive random-access memory cells being electrically connected to a corresponding bit line and selectively interconnected to a corresponding one of said complementary bit lines under control of a corresponding one of said word lines, each of said plurality of magnetoresistive random-access memory cells comprising:
a templating layer comprising a binary alloy having an alternating layer lattice structure;
a half metallic half-Heusler layer comprising a half metallic half-Heusler material having a tetragonal lattice structure, the half metallic half-Heusler layer being located outward of the templating layer, and having a half-Heusler in-plane lattice constant that is different from an in-plane lattice constant in a cubic form of the half metallic half-Heusler material;

a tunnel barrier outward of the half metallic half-Heusler layer; and a magnetic layer outward of the tunnel barrier;

applying signals to said word lines to cause a first subset of said cells to store logical ones and a second subset of said cells to store logical zeroes; and reading said stored logical ones and zeroes via said bit lines and said complementary bit lines.

24. A method of forming a magnetoresistive random-access memory cell, comprising:

providing a templating layer comprising a binary alloy having an alternating layer lattice structure and having a templating layer in-plane lattice constant;

epitaxially growing a half metallic half-Heusler layer on the templating layer, the half metallic half-Heusler layer comprising a half metallic half-Heusler material, the half metallic half-Heusler layer being grown on the templating layer such that the half-Heusler material has a tetragonal lattice structure and a half-Heusler in-plane lattice constant that is different from an in-plane lattice constant in a cubic form of the half metallic half-Heusler material and which substantially matches the templating layer in-plane lattice constant;

forming a tunnel barrier outward of the half metallic half-Heusler layer; and forming a magnetic layer outward of the tunnel barrier.

25. A hardware description language (HDL) design structure encoded on a machine-readable data storage medium, said HDL design structure comprising elements that when processed in a computer-aided design system generates a machine-executable representation of a magnetoresistive random-access memory cell, wherein said (HDL design structure) comprises:

a templating layer comprising a binary alloy having an alternating layer lattice structure;

a half metallic half-Heusler layer comprising a half metallic half-Heusler material having a tetragonal lattice structure, the half metallic half-Heusler layer being located outward of the templating layer, and having a half-Heusler in-plane lattice constant that is different from an in-plane lattice constant in a cubic form of the half metallic half-Heusler material;

a tunnel barrier outward of the half metallic half-Heusler layer; and a magnetic layer outward of the tunnel barrier.

* * * * *